(12) United States Patent
Kwon et al.

(10) Patent No.: US 8,871,591 B2
(45) Date of Patent: Oct. 28, 2014

(54) METHODS OF MANUFACTURING A VERTICAL TYPE SEMICONDUCTOR DEVICE

(75) Inventors: Yong-Hyun Kwon, Hwaseong-si (KR); Dae-Hyun Jang, Seongnam-si (KR); Seong-Soo Lee, Seongnam-si (KR); Kyoung-Sub Shin, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 205 days.

(21) Appl. No.: 13/600,025

(22) Filed: Aug. 30, 2012

(65) Prior Publication Data

US 2013/0095654 A1    Apr. 18, 2013

(30) Foreign Application Priority Data

Oct. 14, 2011    (KR) .......................... 10-2011-0105072

(51) Int. Cl.
*H01L 21/336*    (2006.01)

(52) U.S. Cl.
USPC ......................................................... 438/268

(58) Field of Classification Search
USPC ......................................................... 438/268
See application file for complete search history.

(56) References Cited

U.S. PATENT DOCUMENTS

| 7,855,457 | B2 | 12/2010 | Mizukami et al. | |
|---|---|---|---|---|
| 8,313,998 | B2 * | 11/2012 | Satonaka et al. | 438/268 |
| 2010/0013049 | A1 | 1/2010 | Tanaka et al. | |
| 2011/0031630 | A1 | 2/2011 | Hashimoto | |

FOREIGN PATENT DOCUMENTS

| JP | 2009016400 A | 1/2009 |
|---|---|---|
| JP | 2010027870 A | 2/2010 |
| JP | 2011035237 A | 2/2011 |

* cited by examiner

*Primary Examiner* — Jae Lee
(74) *Attorney, Agent, or Firm* — Harness, Dickey & Pierce, P.L.C.

(57) ABSTRACT

According to example embodiments of inventive concepts, a method includes forming cell patterns and insulating interlayers between the cell patterns on the substrate. An upper insulating interlayer including initial and preliminary contact holes is formed on an uppermost cell pattern. A first reflection limiting layer pattern and a first photoresist layer pattern are formed for exposing a first preliminary contact hole while covering inlet portion of the initial and preliminary contact holes. A first etching process is performed on layers under the first preliminary contact hole to expose the cell pattern at a lower position than a bottom of the first preliminary contact hole. A partial removing process of sidewall portions of the first reflection limiting layer pattern and the first photoresist layer pattern and an etching process on exposed layers through bottom portions of the preliminary contact holes are repeated for forming contact holes having different depths.

20 Claims, 34 Drawing Sheets

CR    CBL    CR

CBL  CR

METHODS OF MANUFACTURING A VERTICAL TYPE SEMICONDUCTOR DEVICE

CROSS-REFERENCE TO RELATED APPLICATIONS

This application claims priority under 35 U.S.C. §119 to Korean Patent Application No. 10-2011-0105072, filed on Oct. 14, 2011 in the Korean Intellectual Property Office, the entire contents of which are incorporated herein by reference.

BACKGROUND

Example embodiments of inventive concepts relate to methods of manufacturing a vertical type semiconductor device, and more particularly to methods of manufacturing a vertical type semiconductor device including vertically integrated wirings.

Recently, methods of vertically integrating cells with respect to a substrate have been developed to accomplish a high integration of semiconductor devices. For the vertical type semiconductor devices including vertically integrated cells, integrated wirings for independently applying electric signals to each cell may be provided. In order to form the integrated wirings, numbers of photolithography processes and numbers of etching processes may be used.

SUMMARY

Example embodiments of inventive concepts relate to methods of manufacturing a vertical type semiconductor device including integrated wirings.

Example embodiments relate to methods of forming integrated wirings.

According to example embodiments of inventive concepts, a method of manufacturing a semiconductor device includes forming cell circuit patterns and insulating interlayers for insulating between each of the cell patterns on a substrate. The cell patterns surround vertically extruded semiconductor patterns. An upper insulating interlayer that defines initial and preliminary contact holes is formed on an uppermost cell pattern of the cell patterns. A first reflection limiting layer pattern and a first photoresist layer pattern are formed on the upper insulating interlayer. The first photoresist layer pattern and the first reflection limiting layer pattern expose a first preliminary contact hole at a first position from an edge portion of the upper insulating layer. The first photoresist layer pattern and the first reflection limiting pattern cover an inlet portion of the initial and preliminary contact holes. A first etching process is performed with respect to layers under the first preliminary contact hole to expose the cell pattern provided at a lower position than a bottom of the first preliminary contact hole. The method includes repeating a partial removing process of sidewall portions of the first reflection limiting layer pattern and the first photoresist layer pattern and an etching process with respect to exposed layers through bottom portions of the preliminary contact holes one by one, for forming contact holes having decreasing depths from the edge portion to a center portion. An insulating spacer is formed on sidewalls of the contact holes. Inner portions of the contact holes including the insulating spacer are filled up with a conductive material to form contacts.

At least one of contacts may be disposed at an exterior side portion of one of the semiconductor patterns.

The contact holes may be formed by partially removing the sidewall portions of the first photoresist pattern and the first reflection limiting layer pattern to form a second refection limiting layer pattern and a second photoresist pattern for selectively exposing a first and second preliminary contact hole of the preliminary contact holes, respectively, at first and second positions from the edge portion of the upper insulating layer. Then, a second etching may be performed with respect to layers exposed through the first and second preliminary contact holes to expose an upper surface of the cell pattern provided at a lower position than respective bottom portions of the first and second preliminary contact holes. The method may further including repeating a partial removing process of the sidewall portions of the reflection limiting layer pattern and the photoresist layer pattern and an etching process with respect to exposed layers through bottom portions of the preliminary contact holes one by one, until a lowermost cell pattern is exposed through the first preliminary contact hole at the first edge portion of the upper insulating layer.

A hard mask pattern may be formed on the upper insulating interlayer.

The cell patterns integrated may include contact forming layers. The contacts make a connection with the contact forming layers.

The cell patterns may include contact forming layers and the contacts formed by the conductive material may connect to the contact forming layers.

The contact forming layers may be sacrificial layers for forming conductive substance layers for wirings. The contact forming layers may include an insulating material having an etching selectivity with respect to the insulating interlayers.

The contact forming layers may be selectively removed. Then, a space formed after the removal of the contact forming layers may be filled up with a metal material.

Side end portions of the contact forming layers may be provided in parallel.

One layer of the cell patterns and one layer of the insulating interlayers may be etched while performing an etching process with respect to layers exposed through the preliminary contact holes.

The forming of the first reflection limiting layer pattern and the first photoresist layer pattern may include forming a reflection limiting layer covering the inlet portion of the initial and preliminary contact holes while keeping space in the initial and preliminary contact holes. The reflection limiting layer may be formed on the upper insulating interlayer. Then, a photoresist layer may be formed on the reflection limiting layer. A photolithography process may be performed with respect to the photoresist layer to form the first photoresist layer pattern. The reflection limiting layer may be etched using the first photoresist layer pattern as a mask.

According to example embodiments of inventive concepts, a method of forming an integrated wiring includes alternately integrating first to n-th insulating interlayers and first to n-th contact forming layers on a substrate. An upper insulating interlayer is formed on the n-th contact forming layer of the first to n-th contact forming layers. The upper insulating interlayer is partially etched to define initial and preliminary contact holes. A first reflection limiting layer pattern and a first photoresist pattern are formed on the upper insulating layer for covering inlet portions of the initial and preliminary contact holes while selectively exposing first preliminary contact holes at first positions from edge portions of the upper insulating layer pattern. A first etching of one of the first to n-th insulating interlayers and first to n-th contact forming layers exposed through the first preliminary contact holes is performed to expose the contact forming layer disposed at a lower position than the bottom portion of the first preliminary contact hole. Sidewalls of the first photoresist pattern and the first reflection limiting layer pattern are partially removed to form a second reflection limiting layer pattern and a second photoresist pattern selectively exposing first and second preliminary contact holes provided at first and second positions from the edge portions. A second etching is performed with respect to layers exposed through the first and second preliminary contact holes to expose the contact forming layers respectively provided at a lower position than the bottom portion of the first and second preliminary contact holes. The contact holes have depths decreasing from the edge portion to a center portion. An insulating spacer is formed on the sidewalls of the contact holes. A conductive material fills up the contact holes including the insulating spacer to form contacts.

Side end portions of the first to n-th contact forming layers may be in parallel.

The contact forming layers may be word lines of a vertical type nonvolatile memory device.

Initial and preliminary contact holes may be in a first region of the substrate. The initial and preliminary contact holes may expose an upper surface of the n-th contact forming layer and the initial and preliminary contact holes may be at a second region of the substrate and make contact with the contact forming layer at a lower position than the n-th contact forming layer.

Vertical type semiconductor devices in accordance with example embodiments of inventive concepts may include integrated wirings having little process dispersion and formed by simplified processes. The manufacturing cost of the semiconductor devices may be decreased and an occurrence of an operation defect and a reliability defect may also be decreased.

According to example embodiments of inventive concepts, a method of manufacturing a semiconductor device includes forming 1 to n-th first and second layer patterns alternatingly stacked, where n is an integer greater than or equal to 3; forming a mask pattern on the n-th second layer pattern of the 1 to n-th second layer patterns, the mask pattern defining 1 to n-th openings spaced apart in a horizontal direction over a first portion of the n-th second layer pattern; and forming a first multilayer pattern on the mask pattern, the first multilayer pattern including a first resist pattern on a first reflection limiting pattern, the first multilayer pattern exposing one of the 1 to n-th openings of the mask pattern. The method further includes forming 1 to n-th contact holes having different depths through the 1 to n-th openings of the mask pattern by (A) etching at least one of the 1 to n-th first and second layer patterns using the mask pattern and the first multilayer pattern as an etch mask and at least one of the 1 to (n−1)-th second layer patterns as an etch stop, (B) laterally removing part of the first multilayer pattern to expose another opening of the 1 to n-th openings of the mask pattern, (C) repeating (A) and (B) until 1 to (n−1)-th contact holes are formed, and (D) removing a remaining portion of the first multilayer pattern to expose the n-th opening as the n-th contact hole; and forming contacts by filling the 1 to n-th contact holes with a conductive material.

A material of at least one of the 1 to n-th first layer patterns may be different than a material of at least one of the 1 to n-th second layer patterns.

A material of the mask pattern may have an etching selectivity with respect to a material of the 1 to n-th first layer patterns and a material of the 1 to n-th second layer patterns.

A plurality of semiconducting patterns may extend vertically through a central portion of the 1 to n-th first and second layer patterns. The central portion of the 1 to n-th first and second layer patterns may be adjacent to the first portion of the n-th second layer pattern.

The mask pattern on the n-th second layer pattern may further define 1 to k-th holes spaced apart in the horizontal direction over a second portion of the n-th second layer pattern, where k is an integer equal to n. The first multilayer pattern may further expose one hole of the 1 to k-th holes of the mask pattern. The forming 1 to n-th contact holes having different depths through the 1 to n-th openings may further including forming 1 to k-th contact trenches having different depths through the 1 to k-th holes of the mask pattern by exposing another hole of the 1 to k-th holes of the mask pattern during the (B) laterally removing part of the first multilayer pattern to expose another opening of the 1 to n-th openings of the mask pattern, repeating the (A) and (B) until the 1 to (k−1)-th contact trenches are formed in addition to the 1 to (n−1)-th contact holes, exposing the k-th holes as the k-th contact trench during the (D) removing the remaining portion of the first multilayer pattern. The method may further include filling the 1 to k-th contact trenches with the conductive material during the forming the contacts.

BRIEF DESCRIPTION OF THE DRAWINGS

The foregoing and other features and advantages of inventive concepts will become apparent from the following description of non-limiting embodiments, as illustrated in the following figures, in which like reference numerals refer to like parts throughout the various figures unless otherwise specified. The drawings are not necessarily to scale, emphases instead being placed upon illustrating the principles of inventive concepts. In the drawings.

DETAILED DESCRIPTION OF EXAMPLE EMBODIMENTS

Figure 1:
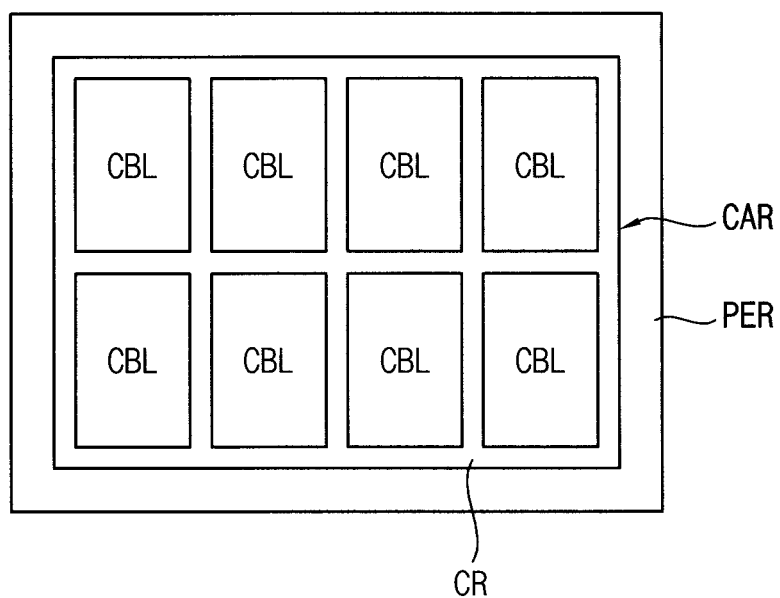
FIG. 1 is a plan view for illustrating a cell arrangement in a memory device according to example embodiments of inventive concepts.

Example embodiments of inventive concepts will be described more fully hereinafter with reference to the accompanying drawings, in which some example embodiments of inventive concepts are shown. Example embodiments of inventive concepts may, however, be embodied in many different forms and should not be construed as limited to the embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of inventive concepts are described herein with reference to cross-sectional illustrations that are schematic illustrations of idealized example embodiments of inventive concepts (and intermediate structures). As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2A:
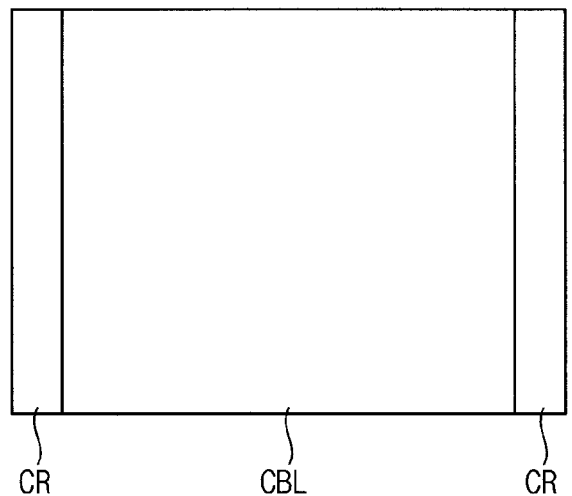
FIGS. 2A and 2B are plan views for illustrating an arrangement of a cell block and a connecting region in a cell region illustrated in FIG. 1.
Figure 2B:
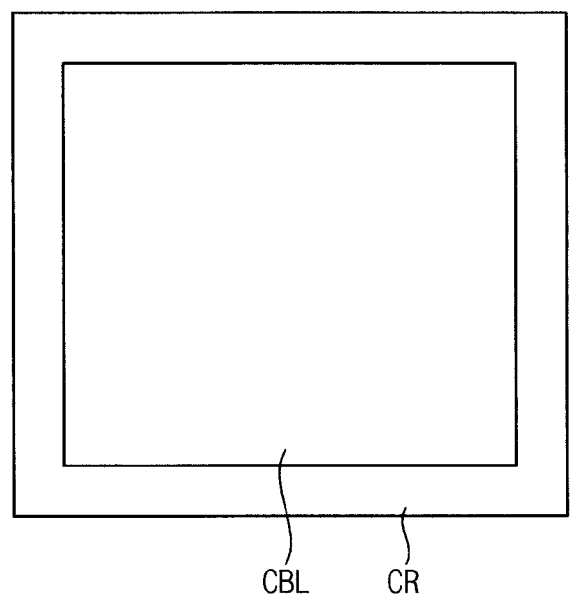

FIG. 1 is a plan view for illustrating a cell arrangement in a memory device. FIGS. 2A and 2B are plan views for illustrating an arrangement of a cell block and a connecting region in a cell region illustrated in FIG. 1.

Referring to FIG. 1, a memory device may be formed on a substrate. The substrate may include a cell array region CAR for arranging memory cells and a peripheral circuit region PER for arranging circuits for driving the memory cells. In the cell array region CAR, cell blocks CBL for forming cells and a connecting region CR for arranging wiring structures may be provided. The connecting region CR may be provided with a space from both edge portions of each of the cell blocks CBL facing to each other. The connecting region CR may include wirings for making an electric connection with conductive patterns included in each cell.

The connecting region CR may be arranged as illustrated in FIGS. 2A and 2B. Referring to FIG. 2A, the connecting regions CR may be provided at both facing sides of the cell block CBL. Referring to FIG. 2B, the connecting region CR may be provided at all sides of the cell block CBL.

The cells formed in the cell block CBL may be integrated in vertical direction. Onto vertically integrated conductive patterns included in each cell, respective electric signal may be applied independently. To accomplish the application, an integrated structure for applying the electric signals to the conductive patterns independently may be formed in the connecting region.

FIGS. 3 to 11 are cross-sectional views for illustrating a method of forming an integrated structure in accordance with example embodiments of inventive concepts.

Figure 3:
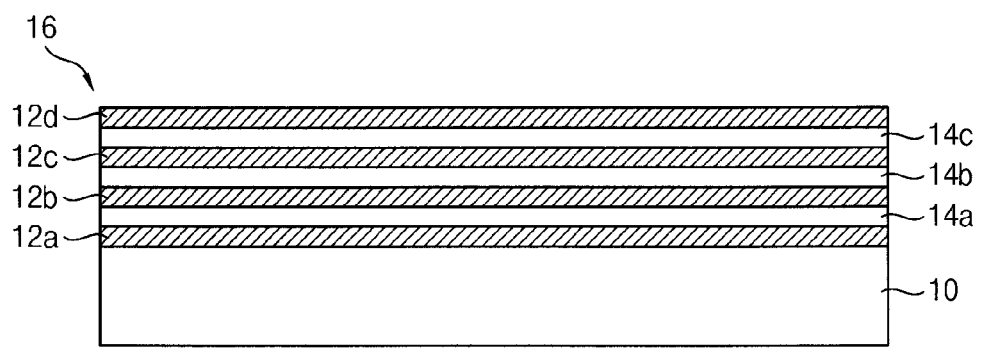
FIGS. 3 to 11 are cross-sectional views and an upper plan view illustrating a method of manufacturing an integrated structure according to example embodiments of inventive concepts.

Referring to FIG. 3, a substrate 10 including a cell block region for forming cells and connecting regions for forming connecting circuits may be provided. The cell block region may have a rectangular shape on the substrate 10. The connecting regions CR may be separated apart from at least one edge portion of the cell block region CBL. The connecting regions may be provided at both side edge portions of the cell block region.

On the substrate 10, first, second, third and fourth contact forming layers 12a, 12b, 12c and 12d and first, second and third insulating interlayers 14a, 14b and 14c may be alternately integrated to form an integrated structure 16. The first to fourth contact forming layers 12a~12d may be exposed by each bottom portion of contact holes to be formed in a following process.

The first to fourth contact forming layers 12a~12d may be conductive layers. Particularly, the first to fourth contact forming layers 12a~12d may include polysilicon or a metal material. Alternatively, the first to fourth contact forming layers 12a~12d may be formed using an insulating material having an etching selectivity with respect to the first to third insulating interlayers 14a~14c. In this case, the first to fourth contact forming layers 12a~12d may be used as sacrificial layers and may be replaced by conductive layers. Particularly, the first to fourth contact forming layers 12a~12d may be formed using silicon nitride.

As illustrated in FIG. 3, the contact forming layers may include four layers and the insulating interlayers may include three layers in the integrated structure 16. Hereinafter, explanation will be given referring to the integrated structure 16 including the first to fourth contact forming layers 12a~12d and the first to third insulating interlayers 14a~14c.

The first to fourth contact forming layers 12a~12d may be formed to have a line shape extending in a first direction. Alternatively, the first to fourth contact forming layers 12a~12d may be formed to have a non-patterned shape within at least the same cell block region.

The first to fourth contact forming layers 12a~12d may have an extending shape from the cell block region to the connecting regions. Each of the first to fourth contact forming layers 12a~12d formed in each layer may extend to the same position. That is, the side edge portions of the first to fourth contact forming layers 12a~12d may not form a stair shape.

The first to third insulating interlayers 14a~14c may be formed using an insulating material such as silicon oxide, but example embodiments of inventive concepts are not limited thereto.

Figure 4:
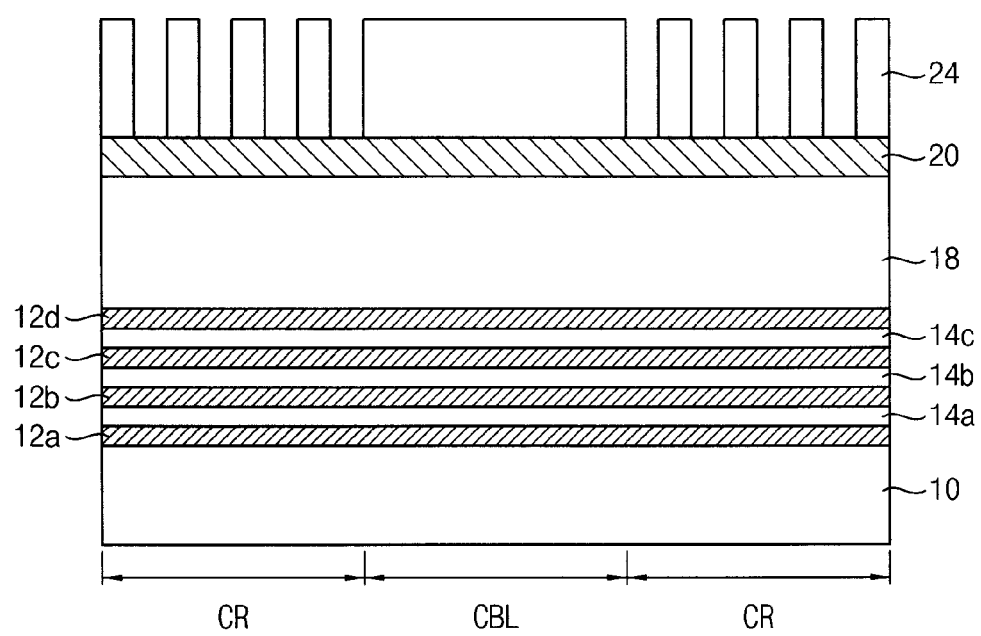

Referring to FIG. 4, an upper insulating interlayer 18 may be formed on the integrated structure 16. The upper insulating interlayer 18 may be an insulating layer between metals for insulating the upper metal wirings. On the upper insulating interlayer 18, a hard mask layer 20 may be formed. The hard mask layer 20 may be used as a mask while performing an etching process for forming a metal contact hole. The hard mask layer 20 may be formed using a material having an etching selectivity with respect to silicon nitride and silicon oxide. For example, the hard mask layer 20 may contain silicon, such as amorphous silicon or polysilicon, but example embodiments are not limited thereto. On the hard mask layer 20, a photoresist layer may be coated. The photoresist layer may be patterned by a photolithography process to form a photoresist pattern 24 for forming the metal contact hole.

Figure 5:
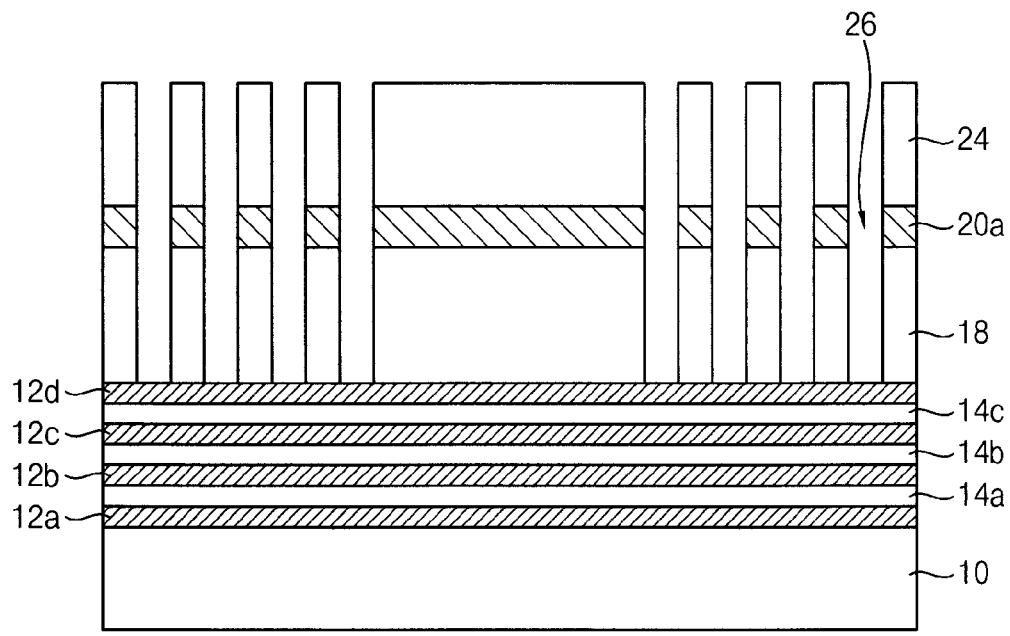

Referring to FIG. 5, the hard mask layer 20 may be anisotropically etched using the photoresist pattern 24 as an etching mask to form a hard mask pattern 20a. Then, the upper insulating interlayer 18 may be etched to expose the uppermost conductive layer, e.g., the fourth contact forming layer 12d and to form initial and preliminary contact holes 26. An ashing process may be performed to remove the photoresist pattern 24 even though not illustrated.

Contact holes connected to each of the first to fourth contact forming layers 12a~12d may be formed. Accordingly, at least the same number of the initial and preliminary contact holes 26 may be formed as the integrated number of the first to fourth contact forming layers 12a~12d. According to example embodiments of inventive concepts, the connecting regions may be connected to the cell block at both sides of the cell block and the contact holes may be symmetrically formed in each of the connecting regions. Accordingly, four initial and preliminary contact holes 26 may be formed in each of the connecting regions.

Figure 6:
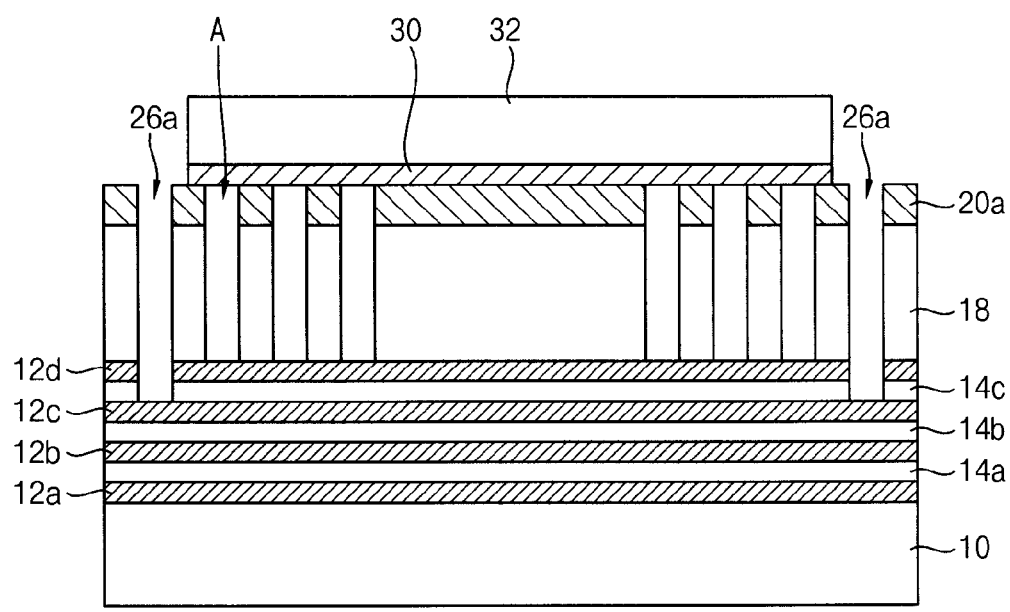

Referring to FIG. 6, on the upper insulating interlayer 18 including the initial and preliminary contact holes 26, a first amorphous carbon layer and a first photoresist layer may be formed. The first amorphous carbon layer may be a reflection limiting layer and may be selected as a thin layer having an inferior step coverage characteristic. The first amorphous carbon layer may be formed on the upper insulating interlayer 18 while not filling up the initial and preliminary contact holes 26. The first amorphous carbon layer may be formed on the upper insulating interlayer 18 while covering inlet portions of the initial and preliminary contact holes 26. Inner portions A of the initial and preliminary contact holes 26 may be empty.

Hereinafter, the initial and preliminary contact holes 26 may be called as first to nth preliminary contact holes one by one from both edge portions to a center portion of the connecting regions.

A first photolithography process may be performed with respect to the first photoresist layer to form a first photoresist pattern 32. The first photoresist pattern 32 may mask a whole region of the cell block region. The first photoresist pattern 32 may be formed to expose first preliminary contact holes 26a disposed at a first position from both side edge portions of the connecting regions and to cover the remaining portion.

The first amorphous carbon layer may be etched using the first photoresist pattern 32 as a mask to form a first amorphous carbon layer pattern 30. In addition, the fourth contact forming layer 12d and the third insulating interlayer 14c exposed through the bottom portions of the first preliminary contact holes 26a may be anisotropically etched to perform a first etching.

In this case, the hard mask pattern 20a may not be etched. Through the first etching process, one layer of the contact forming layer 12d and one layer of the insulating interlayer 14c may be etched. After completing the etching process, the third contact forming layer 12c may be exposed through the bottom portion of the first preliminary contact holes 26a. The first preliminary contact holes 26a may have a greater depth than that of the remaining and neighboring preliminary contact holes.

Figure 7:
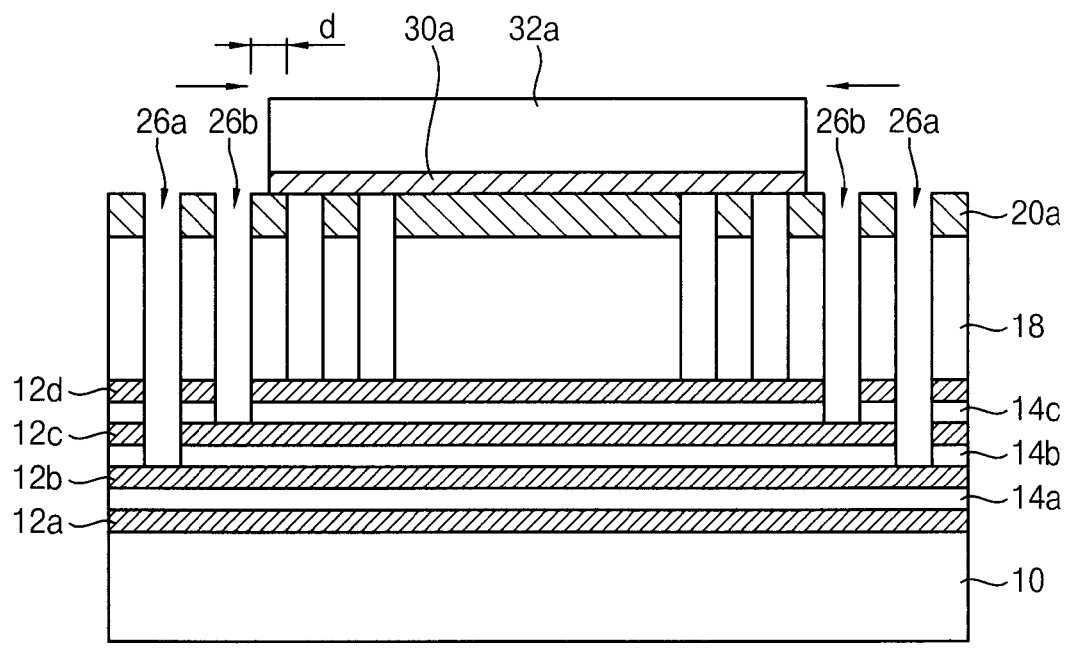

Referring to FIG. 7, a second photoresist pattern 32a may be formed through performing a trimming process of partially etching sidewall portions of the first photoresist layer pattern 32. The first photoresist pattern 32 may be trimmed by a dry etching process using oxygen or ozone as a main etching gas. The second photoresist pattern 32a may expose upper portions of the first and second preliminary contact holes 26a and 26b provided at the first and second positions from both side edge portions to the center portion of the connecting regions. The remaining portion may be covered by the second photoresist pattern 32a.

Figure 8:
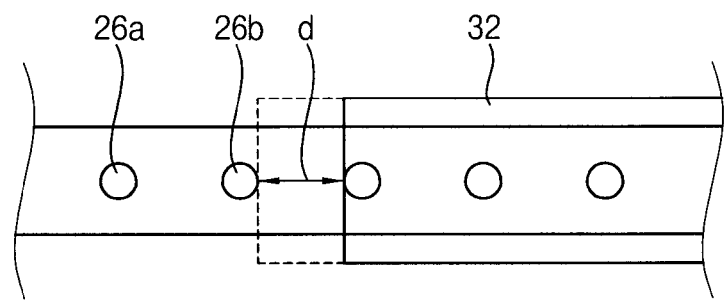

FIG. 8 is an upper plan view for illustrating the trimming portion of the second photoresist pattern 32a.

The second photoresist pattern 32a may selectively expose upper portions of the first and second preliminary contact holes 26a and 26b provided at the first and second positions. Accordingly, an end portion of the second photoresist pattern 32a formed by the trimming and etching process may be positioned between the second and third preliminary contact holes 26b and 26c as illustrated in FIG. 8. The end portion of the second photoresist pattern 32a need not be provided at an accurate one position but may be provided at various positions between the second and third preliminary contact holes 26b and 26c. In this case, the forming position of the contact holes to be formed in a following process may be fixed and defect may not be generated while forming the contact holes. The trimming margin may be a distance (d) between the second and third preliminary contact holes 26b and 26c.

Then, the first amorphous carbon layer pattern 30 exposed after the etching process may be etched to form a second amorphous carbon layer pattern 30a. The third and fourth contact forming layers 12c and 12d and the second and third insulating interlayers 14b and 14c exposed through the bottom portions of the first and second preliminary contact holes 26a and 26b may be anisotropically etched to perform a second etching process. That is, the third contact forming layer 12c and the second insulating interlayer 14b exposed through the bottom portions of the first preliminary contact holes 26a and the fourth contact forming layer 12d and the third insulating interlayer 14c exposed through the bottom portions of the second preliminary contact holes 26b may be etched.

Through performing the second etching process, the first and second preliminary contact holes 26a and 26b having different depths may be formed.

Figure 9:
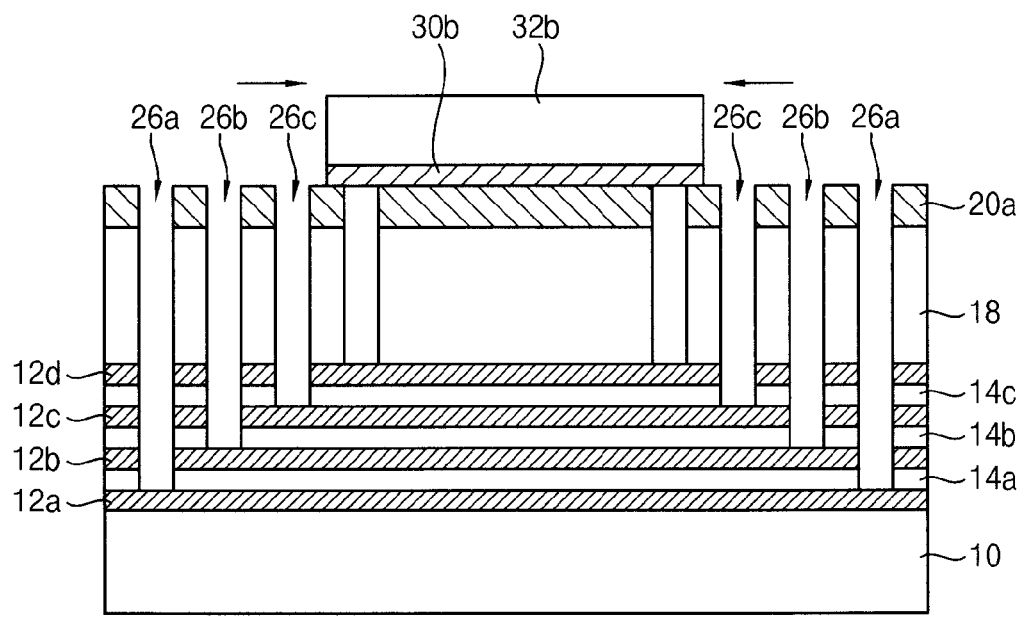

Referring to FIG. 9, a third photoresist layer pattern 32b may be formed by partially etching the sidewall portions of the second photoresist layer pattern 32a to perform a trimming process. The third photoresist layer pattern 32b may selectively expose upper portions of the first, second and third preliminary contact holes 26a, 26b and 26c provided at the first, second and third positions from both side edge portions to the center portion of the connecting regions. The remaining portion may be covered by the third photoresist pattern 32b.

Then, the exposed second amorphous carbon layer pattern 30a may be etched to form a third amorphous carbon layer pattern 30b. The second to fourth contact forming layers 12b~12d and the first to third insulating interlayers 14a~14c exposed through the bottom portions of the first to third preliminary contact holes 26a, 26b and 26c may be anisotropically etched to perform a third etching process.

As described above, the trimming process of the photoresist pattern and the etching process of the thin layers exposed through the bottom portions of the initial and preliminary contact holes may be repeated to complete the forming of the contact holes having different depths decreasing from both side end portions to the center portion of the connecting regions. Particularly, in order to expose the lowermost contact forming layer through the first preliminary contact holes provided at the first edge portions, the trimming process of the photoresist pattern and the etching process of the thin layers exposed through the bottom portions of the initial and preliminary contact holes may be repeatedly performed.

Through performing the above-described processes, the first to fourth contact holes 26a~26d having different depths may be formed in the connecting regions. After forming the first to fourth contact holes 26a~26d, the third photoresist pattern 32b and the third amorphous carbon layer pattern 30b may be removed through an ashing process.

Figure 10:
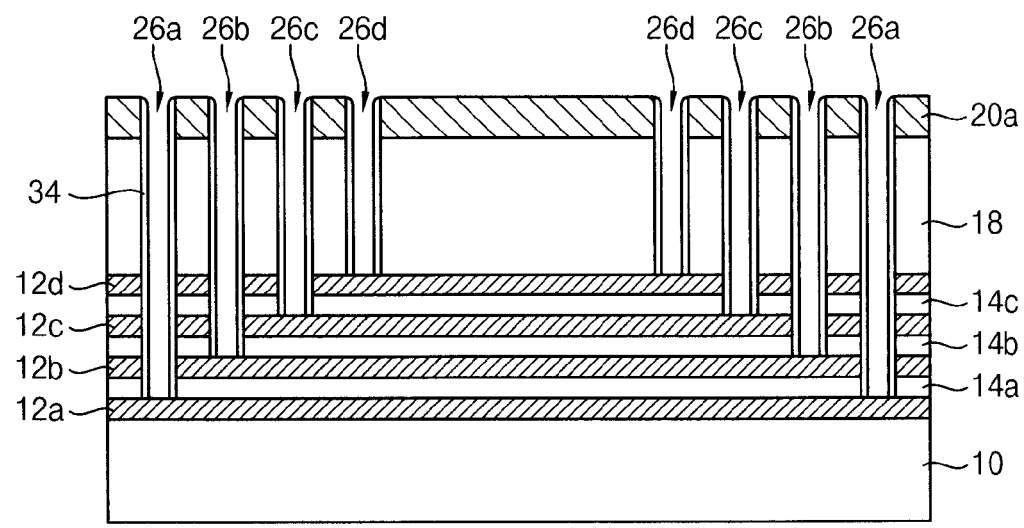

Referring to FIG. 10, a spacer insulating layer may be conformally formed along sidewalls and bottom portions of the first to fourth contact holes 26a~26d and upper portions of the hard mask pattern 20a. The spacer insulating layer may be anisotropically etched to form spacers 34.

Through forming the spacers 34, the first to fourth contact forming layers 12a~12d may not be exposed through the sidewalls of the first to fourth contact holes 26a~26d. However, the first to fourth contact forming layers 12a~12d may be exposed through the bottom portions of the first to fourth contact holes 26a~26d.

Figure 11:
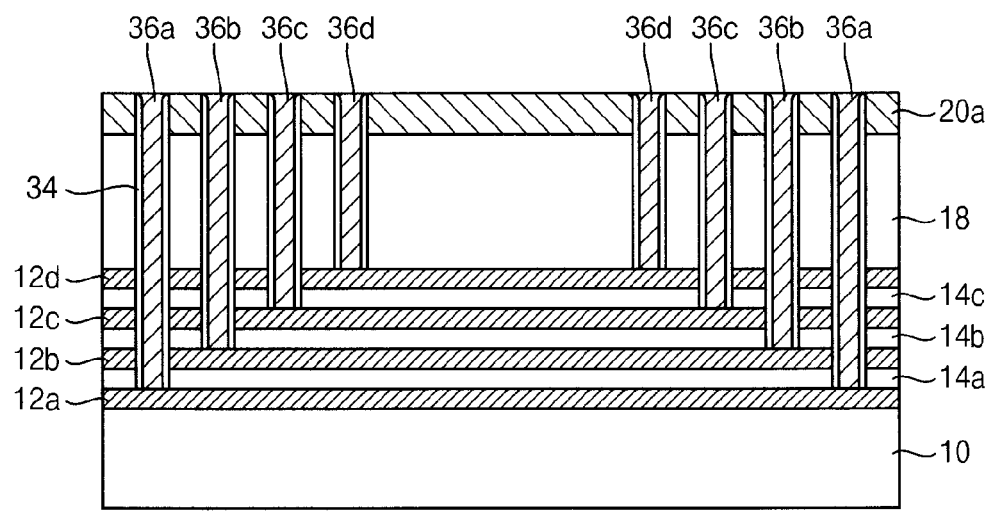

Referring to FIG. 11, a conductive layer for filling up the first to fourth contact holes 26a~26d may be formed. The conductive layer may include a barrier metal layer and a metal layer.

Then, the conductive layer formed on the hard mask pattern 20a may be removed. The conductive layer may be removed by a chemical mechanical polishing process or an etch-back process. Through performing the processes, first to fourth metal contacts 36a~36d may be formed in the contact holes. The first to fourth metal contacts 36a~36d may be respectively connected to the first to fourth contact forming layers 12a~12d in each layer.

According to the above described methods, pad regions for forming the contact holes 26a~26d may not need to be formed separately at the edge portions of the contact forming layers 12a~12d when forming a wiring structure for independently applying electric signals to each of the contact forming layers 12a~12d. That is, an etching process with respect to the contact forming layers 12a~12d to form extending portions at the edge portions of the contact forming layers 12a~12d having different lengths to form a stair shape may not be needed to perform. When the contact forming layers are formed in a stair shape as described above, the contact holes may not be formed on the contact forming layers but may be formed on a position deviated from the contact forming layers. However, since the contact forming layers 12a~12d may extend to the end portions of the connecting regions in accordance with example embodiments of inventive concepts, the contact holes 26a~26d and the contact forming layers 12a~12d may be formed at desired positions. Accordingly, mis-alignment of the contact holes 26a~26d and the contact forming layers 12a~12d may be limited (and/or prevented).

In addition, an etching margin of the photoresist pattern may be increased while performing the trimming process of the photoresist pattern for forming the contact holes 26a~26d. Accordingly, defects generated while forming the contact holes 26a~26d may be decreased.

Further, since the pad region may not be formed while forming the integrated structure, numbers of the photolithography process may be decreased. Accordingly, the integrated wiring structure may be formed by simplified processes with decreased cost.

FIGS. 12A to 23B are cross-sectional views and perspective views for illustrating a method of manufacturing a nonvolatile memory device in accordance with example embodiments of inventive concepts.

Figure 12A:
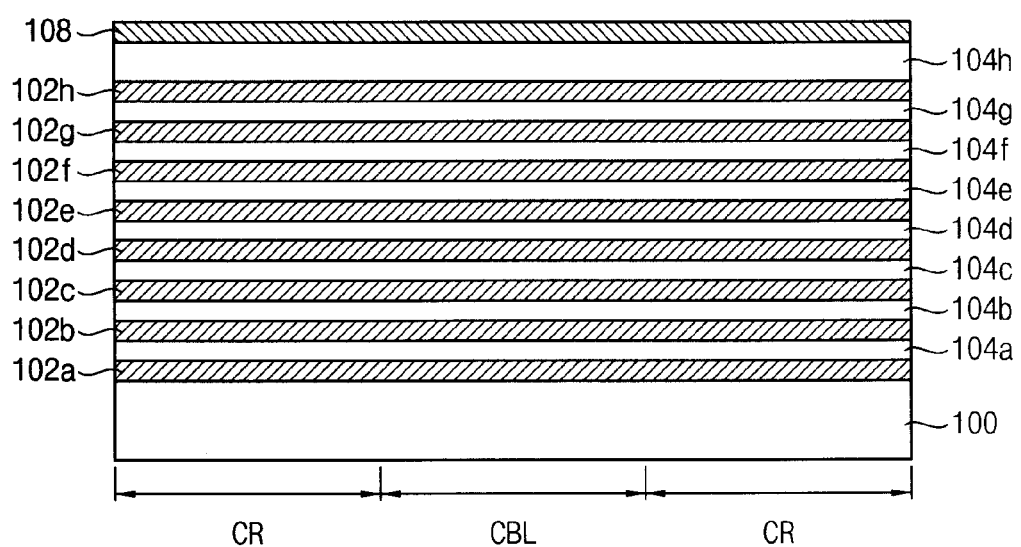
FIGS. 12A to 23B are cross-sectional views and perspective views for illustrating a method of manufacturing a nonvolatile memory device according to example embodiments of inventive concepts.
Figure 12B:
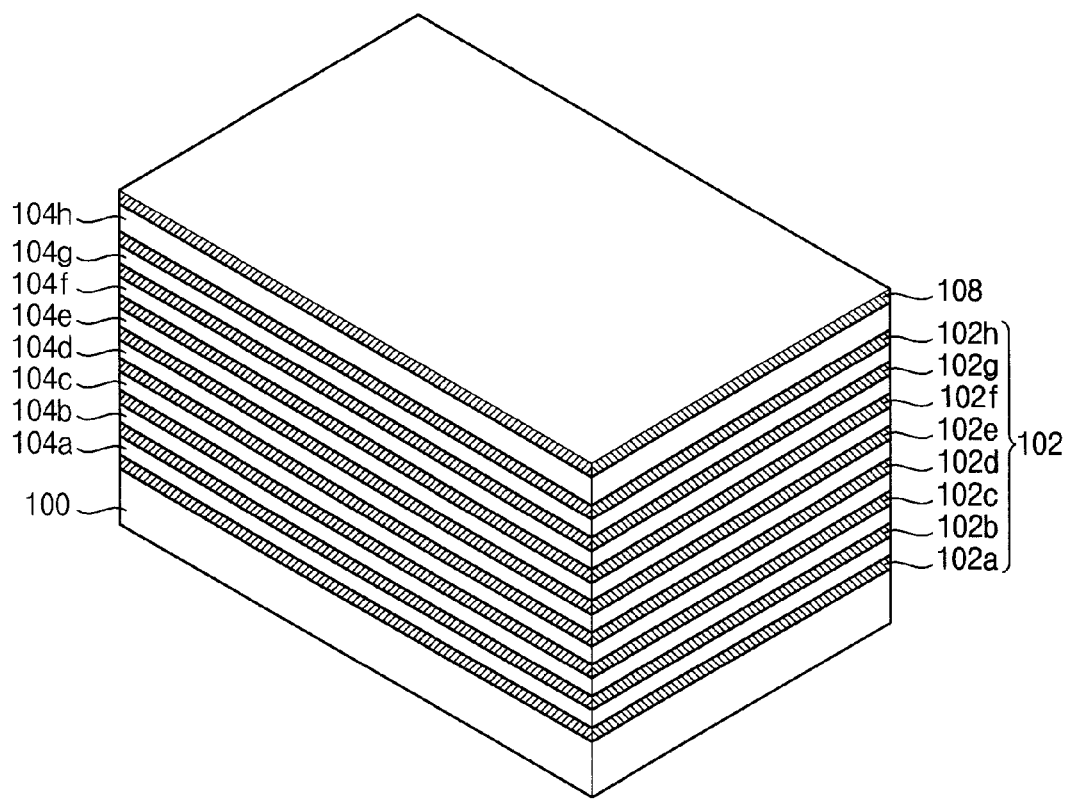

Referring to FIGS. 12A and 12B, a semiconductor substrate 100 including a cell block region for forming memory cells and separately formed connecting regions may be provided. The semiconductor substrate 100 may be a single crystalline silicon substrate.

A pad insulating layer (not illustrated) may be formed on the semiconductor substrate 100. On the pad insulating layer, first to eighth sacrificial layers 102a~102h and first to eighth insulating interlayers 104a~104h may be alternately integrated. The first to eighth insulating interlayers 104a~104h may be formed by depositing silicon oxide. The first to eighth sacrificial layers 102a~102h may be formed using a material having an etching selectivity with respect to the first to eighth insulating interlayers 104a~104h. Particularly, the first to eighth sacrificial layers 102a~102h may be formed using silicon nitride.

The first to eighth sacrificial layers 102a~102h formed in each layer may be a mold layer 102 to be formed as word lines, respectively, through subsequent processes. Each of the sacrificial layers 102a~102h may be formed to have the same thickness. In addition, each of the insulating interlayers 104a~104h may be formed to have the same thickness. The uppermost insulating interlayer 104h may have a greater thickness than other insulating interlayers.

A stopping layer 108 may be formed on the uppermost insulating interlayer 104h. The stopping layer 108 may be formed using silicon nitride.

Figure 13A:
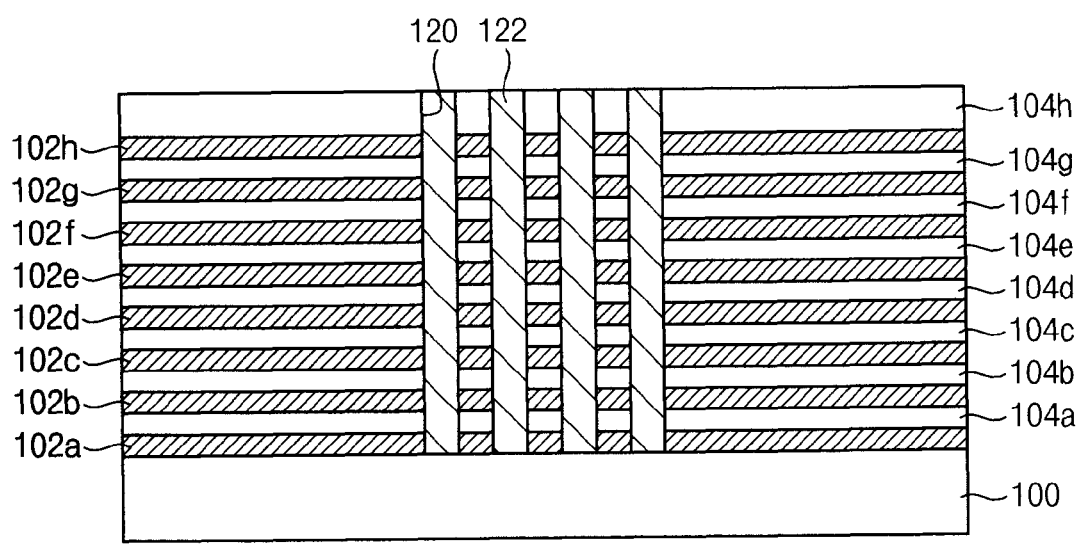
Figure 13B:
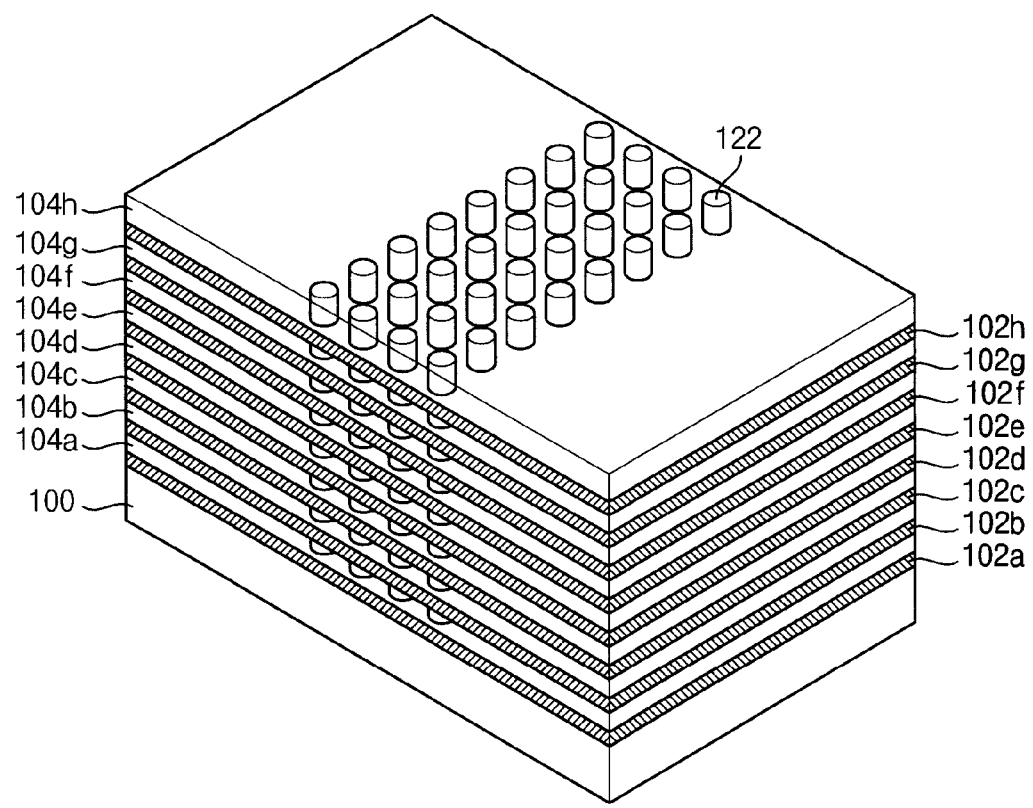

Referring to FIGS. 13A and 13B, an etching mask pattern (not illustrated) for forming channel holes 120 may be formed on the stopping layer 108. The channel holes 120 may be formed in the cell block region. The first to eighth insulating interlayers 104a~104h and the first to eighth sacrificial layers 102a~102h under the etching mask pattern may be etched one by one using the etching mask pattern to form a plurality of channel holes 120. The surface portion of the substrate 100 may be exposed through the channel holes 120. The channel holes 120 may be arranged in a row.

A semiconductor material layer for filling up the inner portions of the channel holes 120 may be formed and then, polished to form semiconductor patterns 122 having a pillar shape. Through performing the processes, most part of the stopping layer 108 may be removed.

Alternatively, a first semiconductor pattern having a macaroni shape or a cylinder shape may be formed on sidewall portions and bottom portions of the channel holes 120 and then, silicon oxide patterns filling up the channel holes 120 may be formed on the surface of the first semiconductor pattern. In this case, the inlet portions of the channel holes 120 may be covered with second semiconductor patterns.

Figure 14:
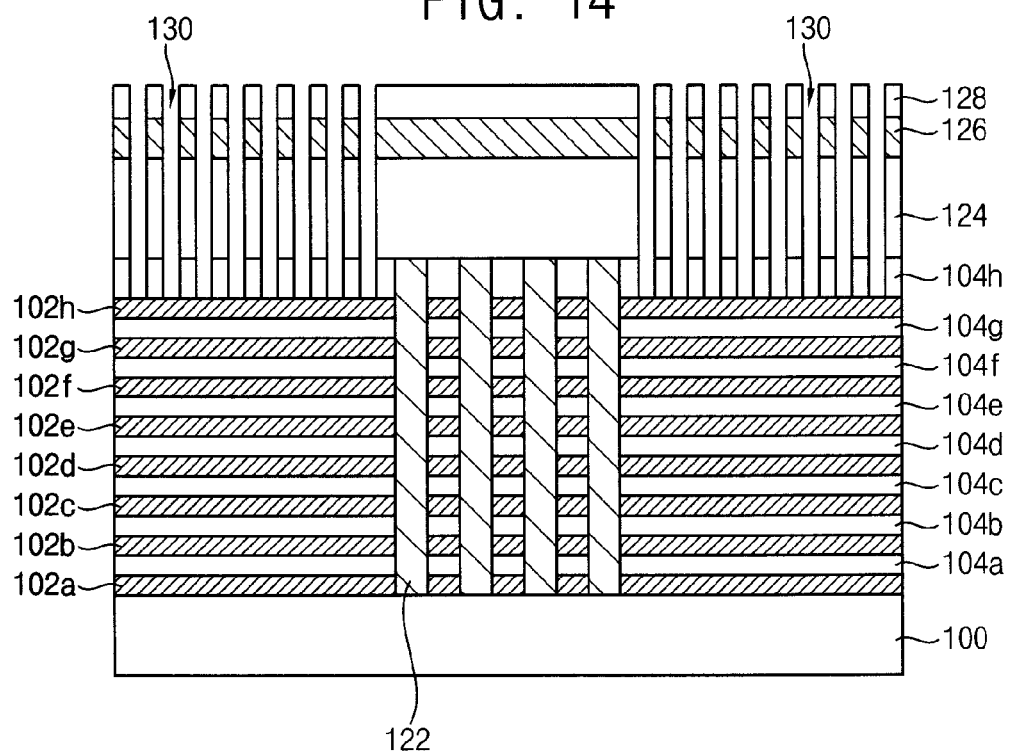

Referring to FIG. 14, an upper insulating interlayer 124 may be formed on the eighth insulating interlayer 104h. A hard mask layer may be formed on the upper insulating interlayer 124. The hard mask layer may be formed using a material having an etching selectivity with respect to silicon oxide and silicon nitride, respectively. For example, the hard mask layer 20 may contain silicon, such as amorphous silicon or polysilicon, but example embodiments are not limited thereto.

A photoresist pattern 128 may be formed by a photolithography process on the hard mask layer. The hard mask layer may be etched to form a hard mask layer pattern 126. The upper insulating interlayer 124 may be etched to form initial and preliminary contact holes 130. The initial and preliminary contact holes 130 may be provided at outer side portions of the semiconductor patterns formed at the outermost position. That is, the initial and preliminary contact holes 130 may be formed in the connecting regions.

The initial and preliminary contact holes 130 may be formed by performing the photolithography process once and the etching process once. The initial and preliminary contact holes 130 may be formed at accurate positions while keeping a desired distance. The initial and preliminary contact holes 130 may be spaced apart from each other with the same distance.

The above described processes are the same (and/or substantially the same) as the explanation given referring to FIGS. 4 and 5.

Figure 15:
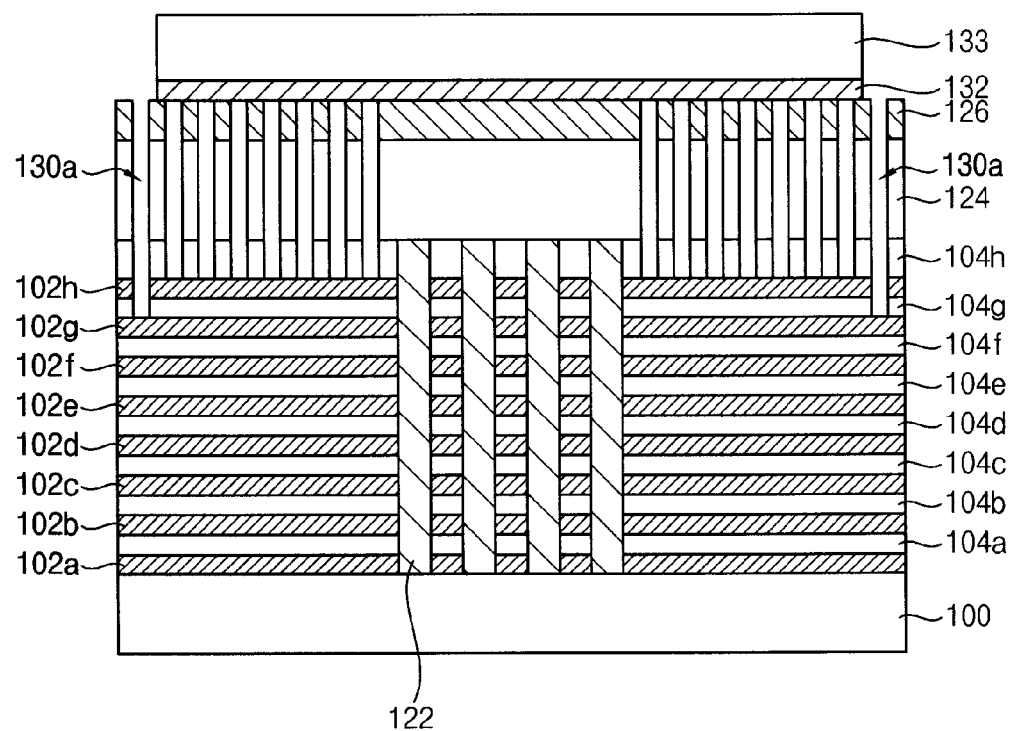

Referring to FIG. 15, a first amorphous carbon layer as a reflection limiting layer and a first photoresist layer may be formed on the upper insulating interlayer 124 including the initial and preliminary contact holes 130. A first photoresist pattern 133 for masking the whole cell block region and for selectively exposing upper portions of first preliminary contact holes 130a provided at a first position from both side edge portions of the connecting regions may be formed.

The first amorphous carbon layer may be etched using the first photoresist pattern 133 as an etching mask to form a first amorphous carbon layer pattern 132. Then, one of the sacrificial layers and one of the insulating interlayers exposed through the bottom portions of the first preliminary contact holes 130a may be etched. After completing the etching process, the seventh sacrificial layer 102g may be exposed through the bottom portions of the first preliminary contact holes 130a.

Figure 16:
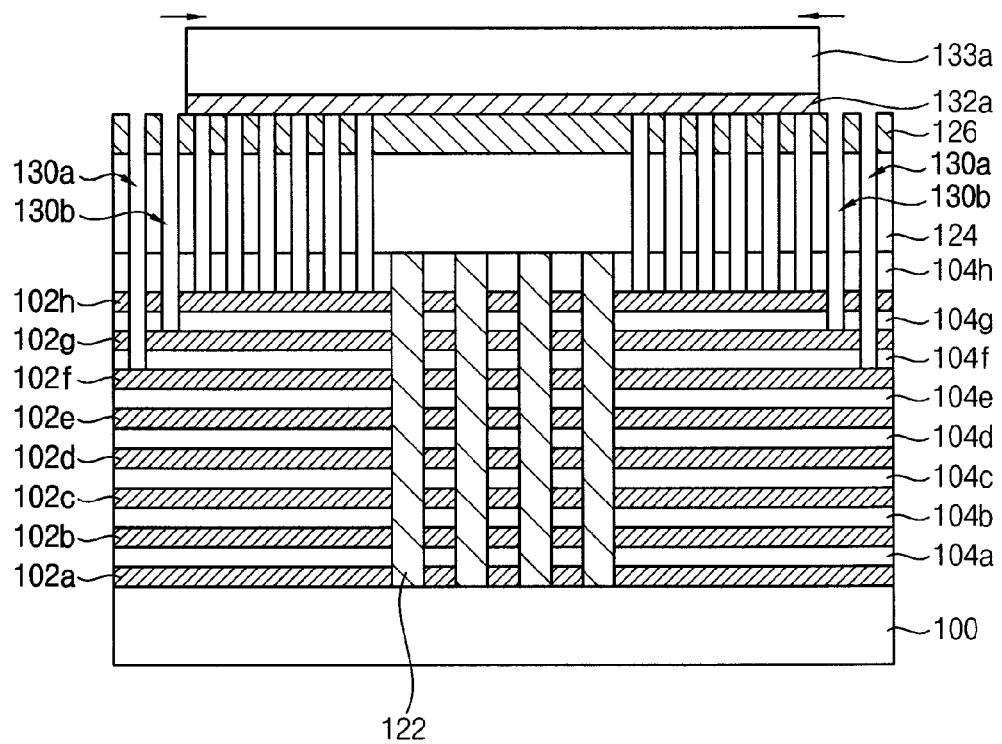

Referring to FIG. 16, a second photoresist pattern 133a may be formed through performing a trimming process of partially etching sidewall portions of the first photoresist layer pattern 133. The first photoresist pattern 133 may be etched by a dry etching process using oxygen or ozone as a main etching gas. The second photoresist pattern 133a may expose upper portions of the first and second preliminary contact holes 130a and 130b provided at the first and second positions from both side edge portions to the center portions of the connecting regions. The remaining portion may be covered by the second photoresist pattern 133a.

Then, the first amorphous carbon layer pattern 132 exposed by the etching process may be etched using the second photoresist pattern 133a as an etching mask to form a second amorphous carbon layer pattern 132a. One layer among the sacrificial layers and one layer among the insulating interlayers exposed through the bottom portions of the first and second preliminary contact holes 130a and 130b may be anisotropically etched.

The trimming process with respect to the photoresist pattern and the etching process with respect to the thin layer exposed through the bottom portions of the initial and preliminary contact holes may be repeatedly performed to form contact holes having depths gradually decreasing from the both side edge portions to the center portions of the connecting regions.

Figure 17:
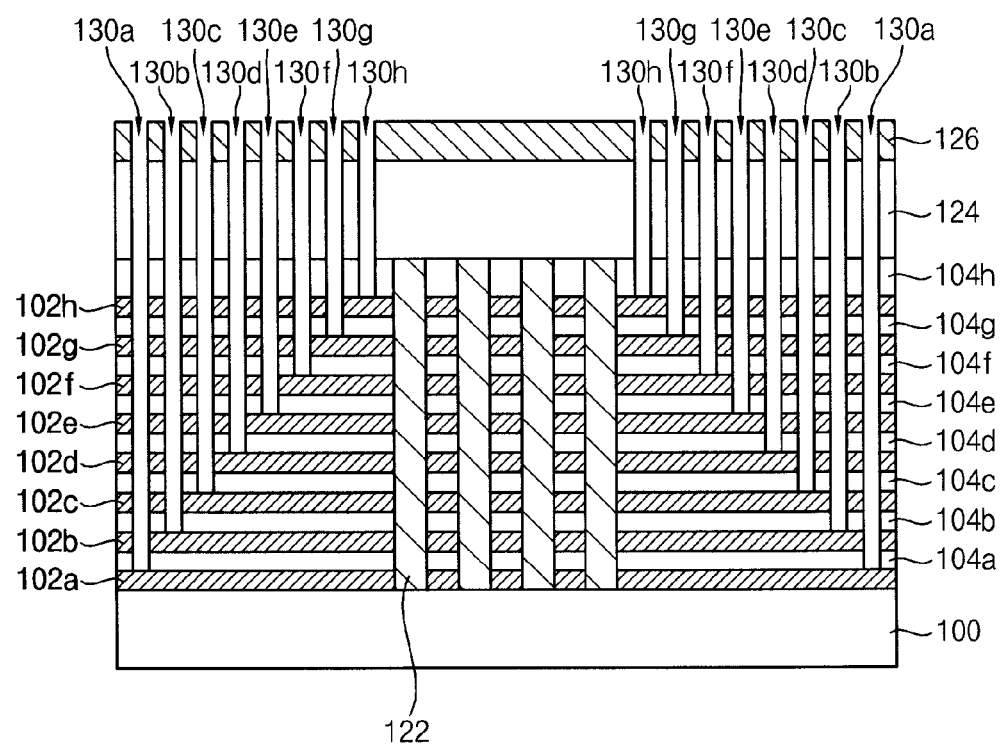

Referring to FIG. 17, the trimming process of the photoresist pattern and the etching process of the thin layer exposed through the bottom portions of the initial and preliminary contact holes 130 may be repeated until the lowermost sacrificial layer, i.e. the first sacrificial layer 102a may be exposed through the first preliminary contact hole 130a provided at the first edge positions, thereby forming first to eighth contact holes 130a~130h.

Detailed processes for forming the first to eighth contact holes 130a~130h may be the same (and/or substantially the same) as the explanation described in FIGS. 3-11.

Figure 18A:
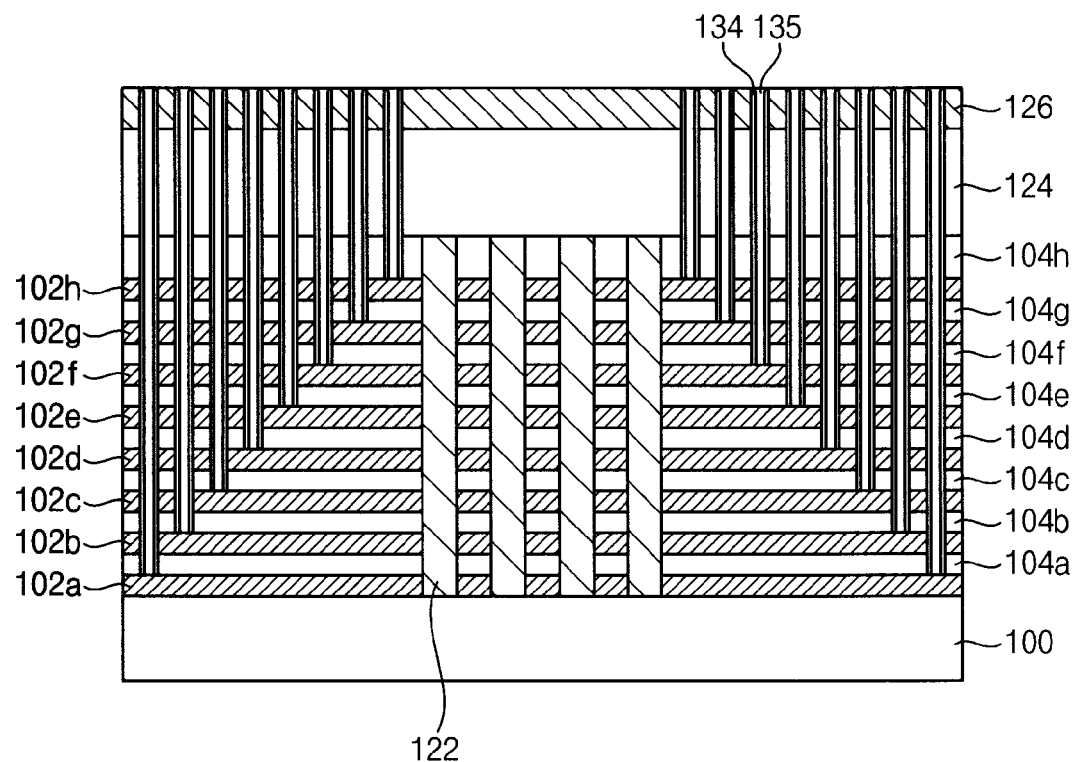
Figure 18B:
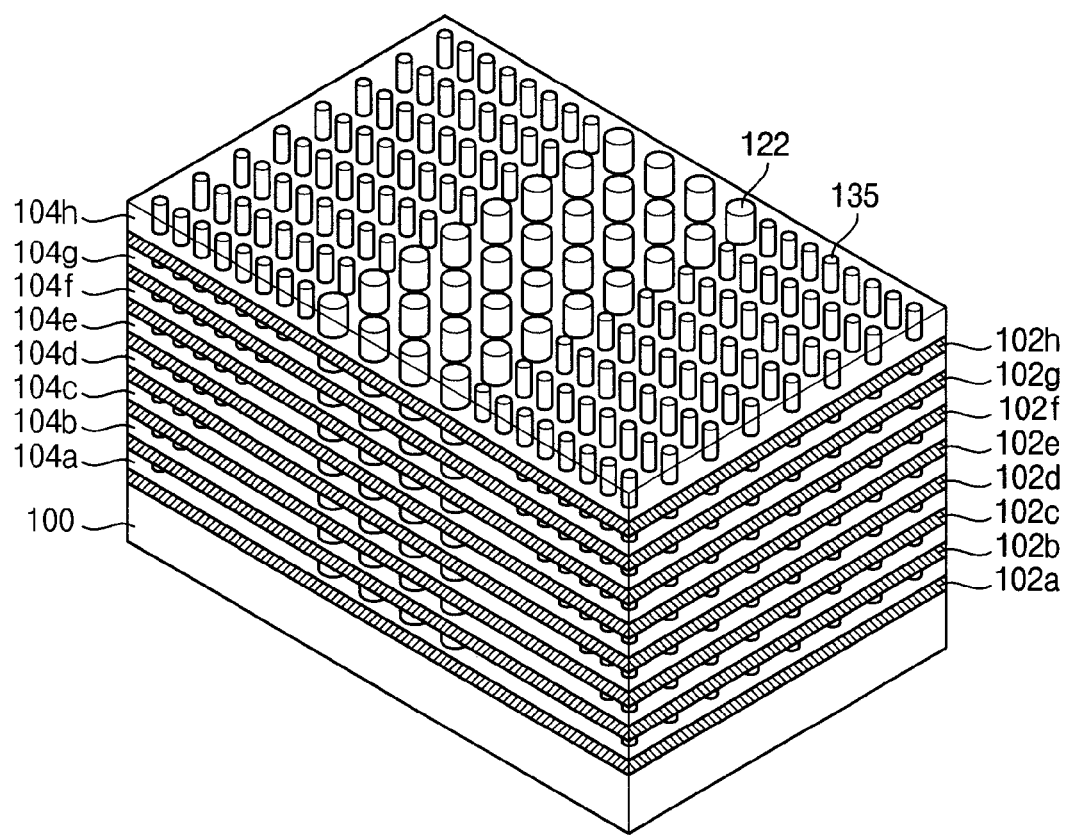

Referring to FIGS. 18A and 18B, a spacer insulating layer may be conformally formed along sidewalls and bottom portions of the first to eighth contact holes 130a~130h and along upper surfaces of the hard mask pattern 126. The spacer insulating layer may be anisotropically etched to form spacers 134 on the sidewalls of the first to eighth contact holes 130a~130h. The spacers 134 may be formed using silicon oxide or silicon nitride.

Burying layers 135 may be formed in the first to eighth contact holes 130a~130h including the spacers 134 formed thereon. The burying layers 135 may be temporary layers filling up the first to eighth contact holes 130a~130h to protect the contact holes 130a~130h until finally filling up the contact holes 130a~130h using a conductive material in a following process. Accordingly, the burying layers 135 may not be formed using the conductive material. The burying layers 135 may be formed using a material having an etching selectivity with respect to the spacers 134. The material may be easily removed by an etching process.

Figure 19:
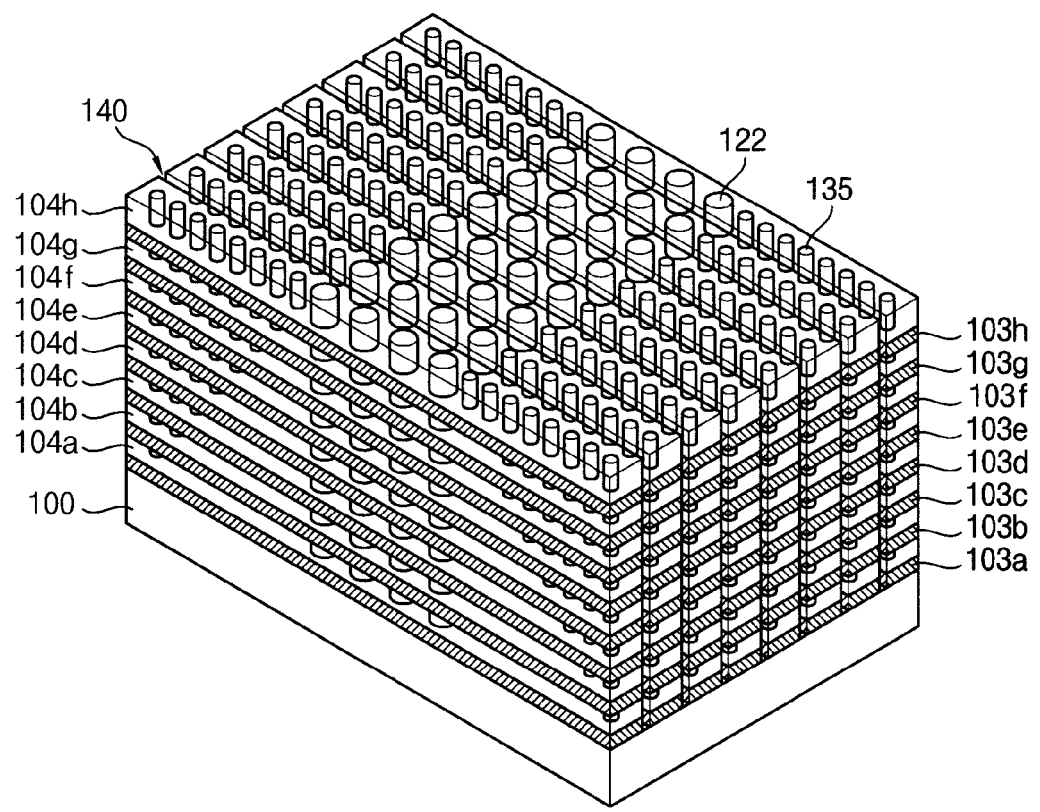

Referring to FIG. 19, the insulating interlayers, the sacrificial layers and the stopping layers disposed between the semiconductor patterns 122 may be etched to form opening portions 140. The opening portions 140 may have a trench shape extending in a first direction.

After forming the opening portions 140, the sacrificial layers 102a~102h may form first to eighth sacrificial layer patterns 103a~103h having a shape surrounding the semiconductor patterns 122 and extending in the cell block region and the connecting regions. Through the bottom portions of the opening portions 140, the surface of the substrate 100 may be exposed.

Figure 20:
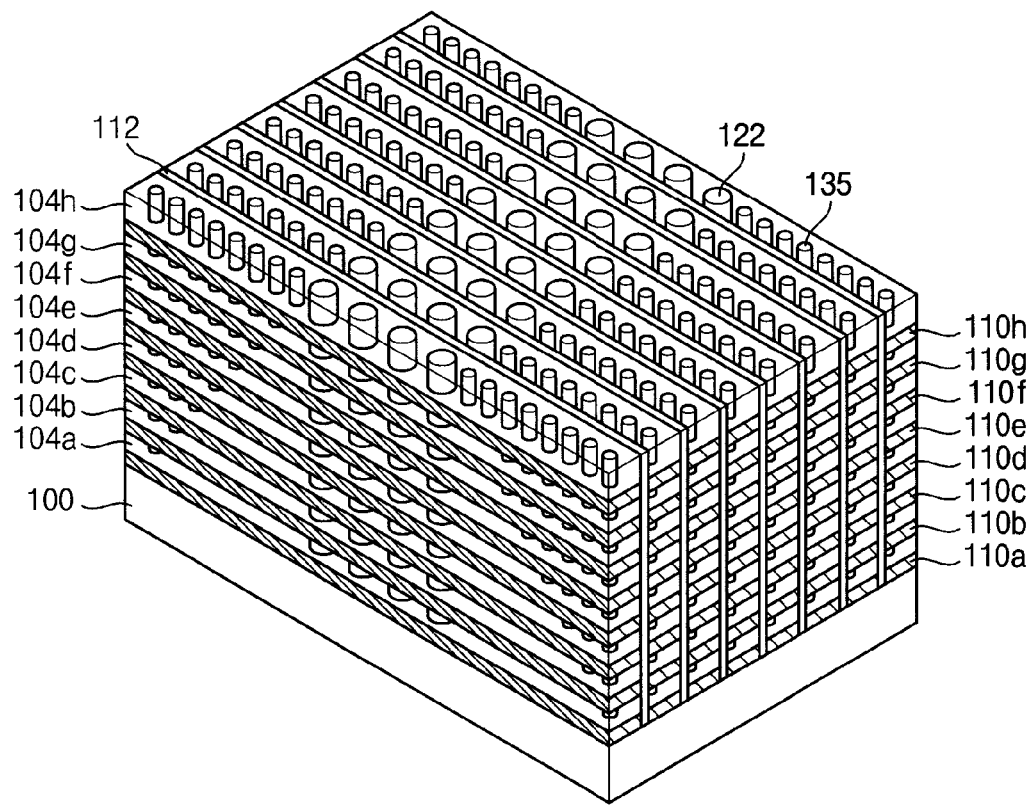

Referring to FIG. 20, after forming the opening portions 140, the first to eighth sacrificial layer patterns 103a~103h exposed to the sidewalls of the opening portions 140 may be removed to form grooves.

Along inner surface portions of the grooves and the opening portions 140, a tunnel insulation layer (not illustrated), a charge trapping layer (not illustrated) and a blocking dielectric layer (not illustrated) may be formed. On the blocking dielectric layer, a conductive layer (not illustrated) completely filling up the inner portions of the grooves may be formed. The conductive material may include a metal. The conductive material may include a material having a low electric resistivity such as tungsten, tungsten nitride, titanium, titanium nitride, tantalum, tantalum nitride, platinum, etc. Particularly, a barrier metal layer formed using titanium, titanium nitride, tantalum, tantalum nitride, etc. may be formed first and then a metal layer using tungsten may be formed to form the conductive layer.

Then, the conductive layer formed in the opening portions 140 may be etched. The removing process may be performed by a wet etching process. Only the conductive layer within the grooves may remain to form first to eighth control gate electrodes 110a~110h. The control gate electrodes 110a~110h may be numbered from first to eighth from the surface portion of the substrate 100 to upward one by one.

Into the substrate 100 exposed through the bottom portions of the opening portions 140 between the first to eighth control gate electrodes 110a~110h, n-type impurities may be doped to form an impurity doped region (not illustrated) used as a source line S/L.

An insulating layer filling up the opening portions 140 may be formed and then planarized by a polishing process to form insulating layer patterns 112.

Figure 21:
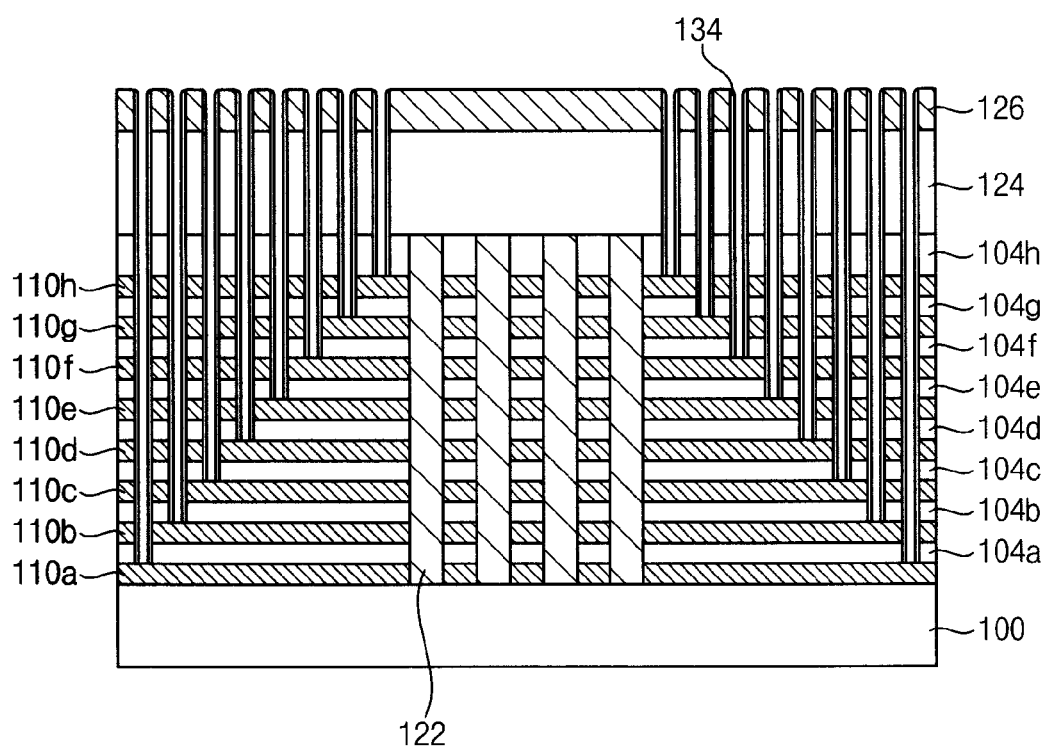

Referring to FIG. 21, a mask pattern (not illustrated) covering the cell block region may be formed. The burying layer 135 formed in the contact holes 130a~130h formed in the connecting regions may be removed.

Figure 22:
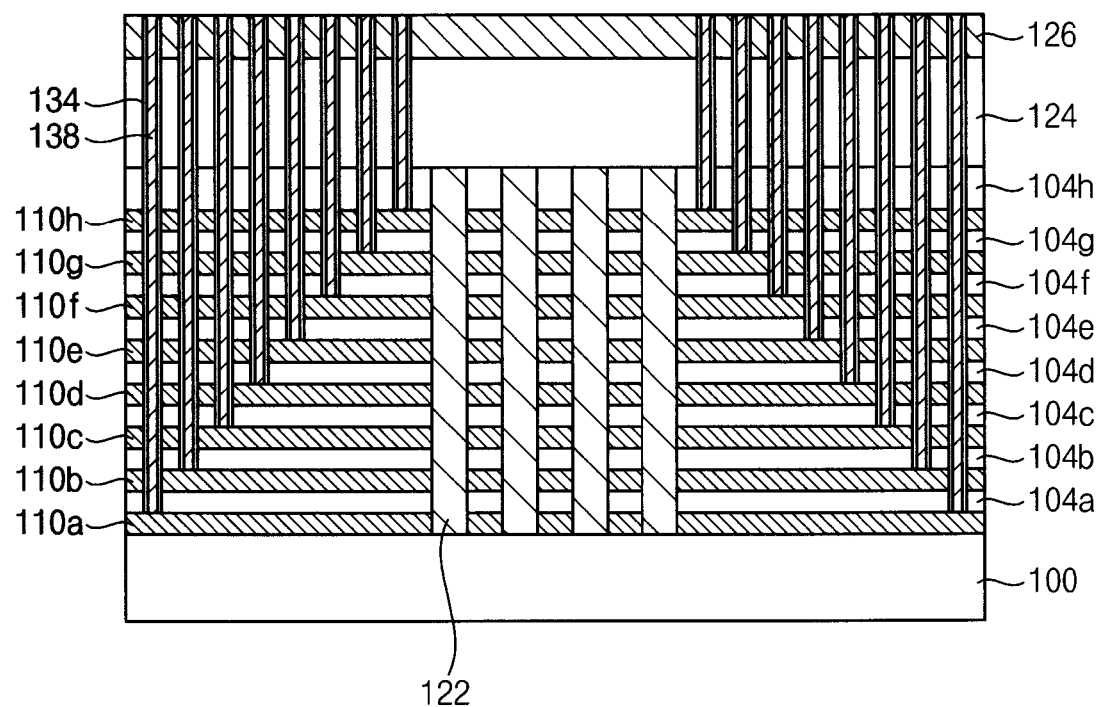

Referring to FIG. 22, a conductive layer may be formed in the first to eighth contact holes 130a~130h. The conductive layer may be formed using a metal material. Particularly, the conductive layer may be formed by forming a barrier metal layer using one of titanium, titanium nitride, tantalum, tantalum nitride, etc. first and then, a metal layer using tungsten.

The conductive layer may be polished to form contact plugs 138 connected to the first to eighth control gate electrodes 110a~110h formed in each layer.

Figure 23A:
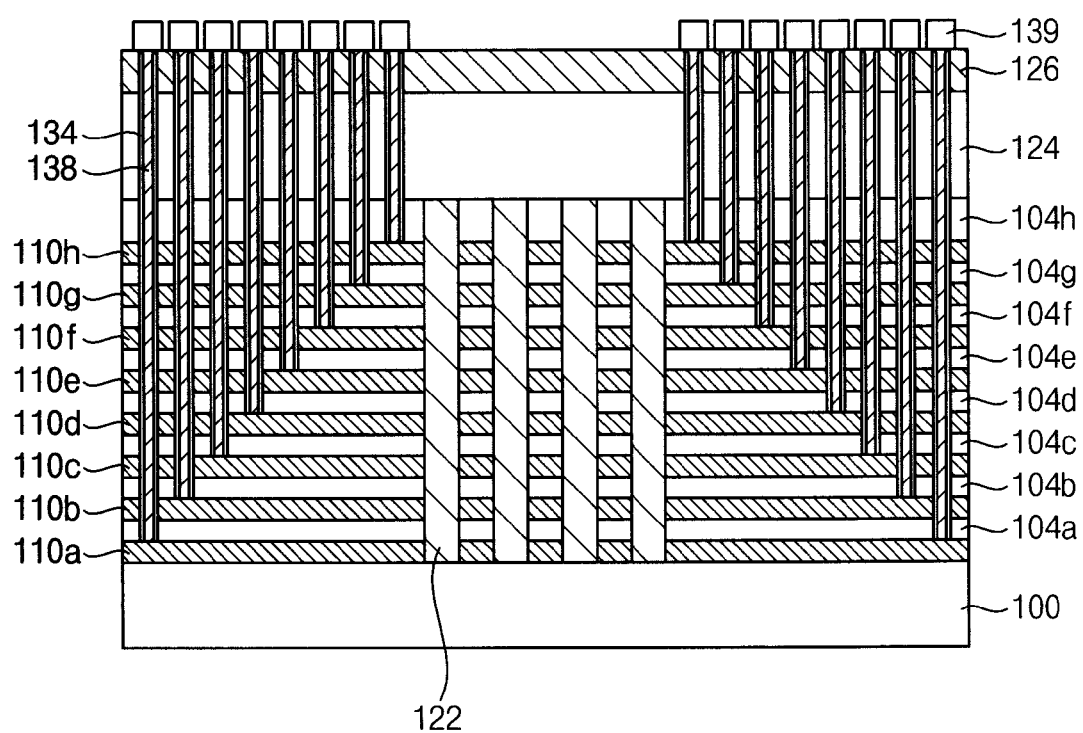
Figure 23B:
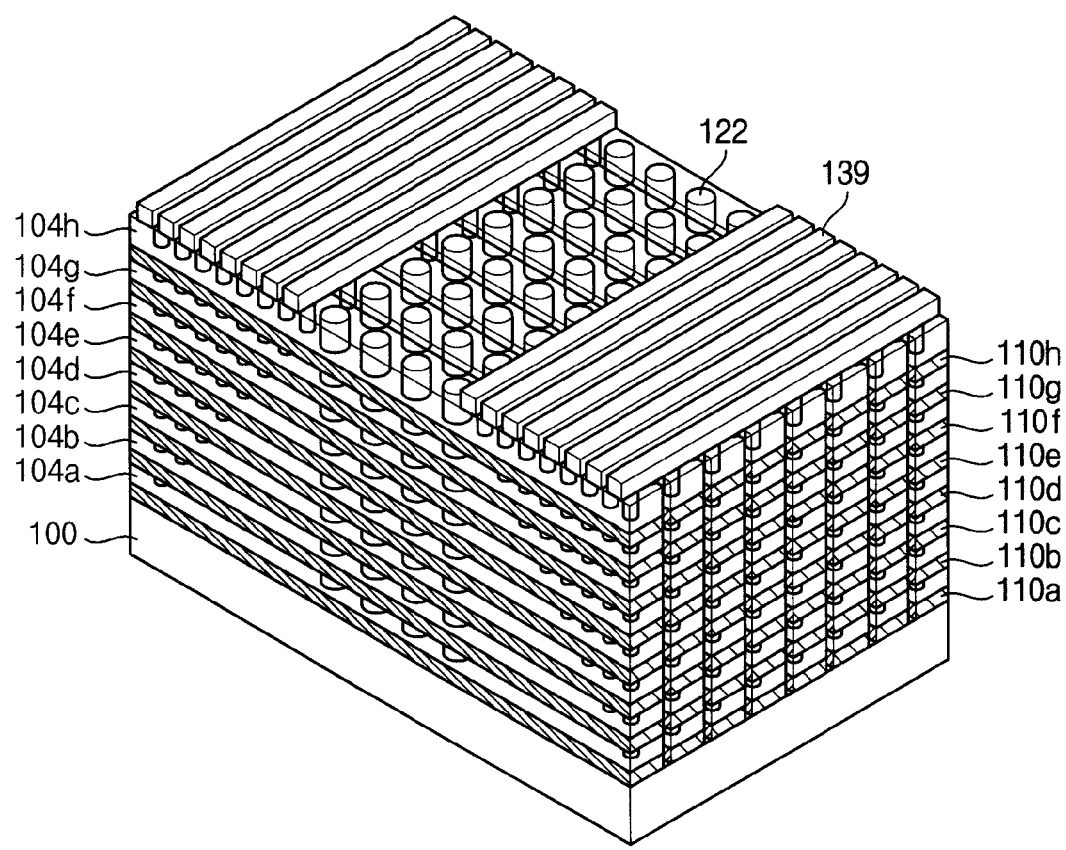

Referring to FIGS. 23A and 23B, upper wirings 139 connected to the contact plugs 138 may be formed to manufacture a nonvolatile memory device.

By performing the above described processes, the control gates formed using a metal material and contact plugs making an electrical connection to each of the control gates may be formed by simplified processes.

Figure 24:
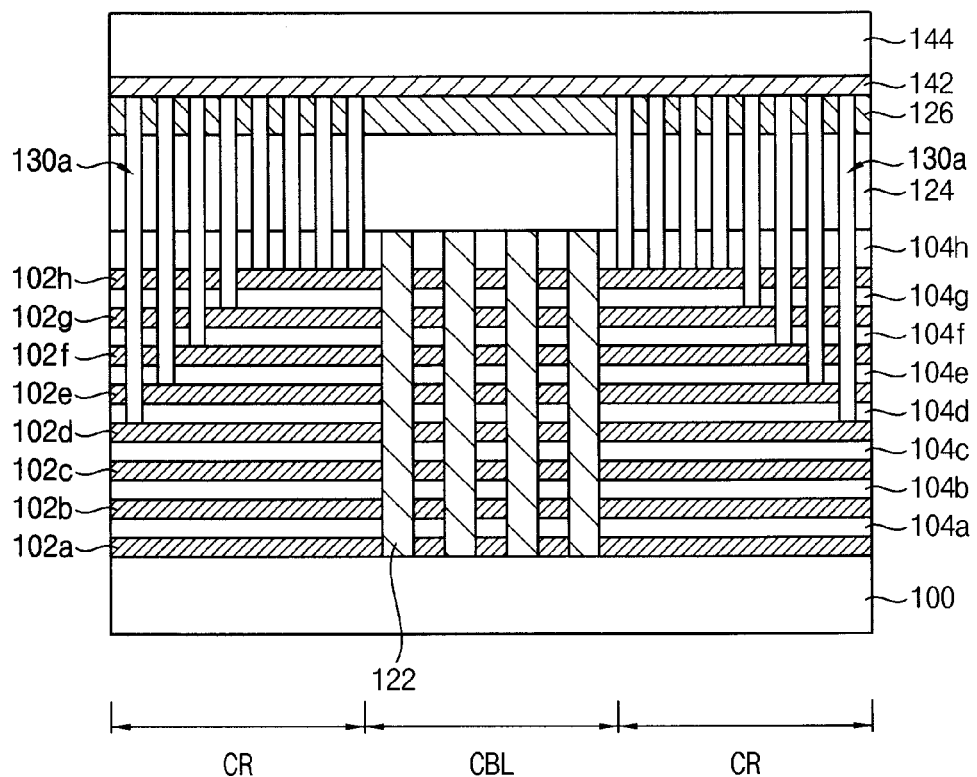
FIGS. 24 and 25 are cross-sectional views for illustrating a method of manufacturing a nonvolatile memory device according to example embodiments of inventive concepts.
Figure 25:
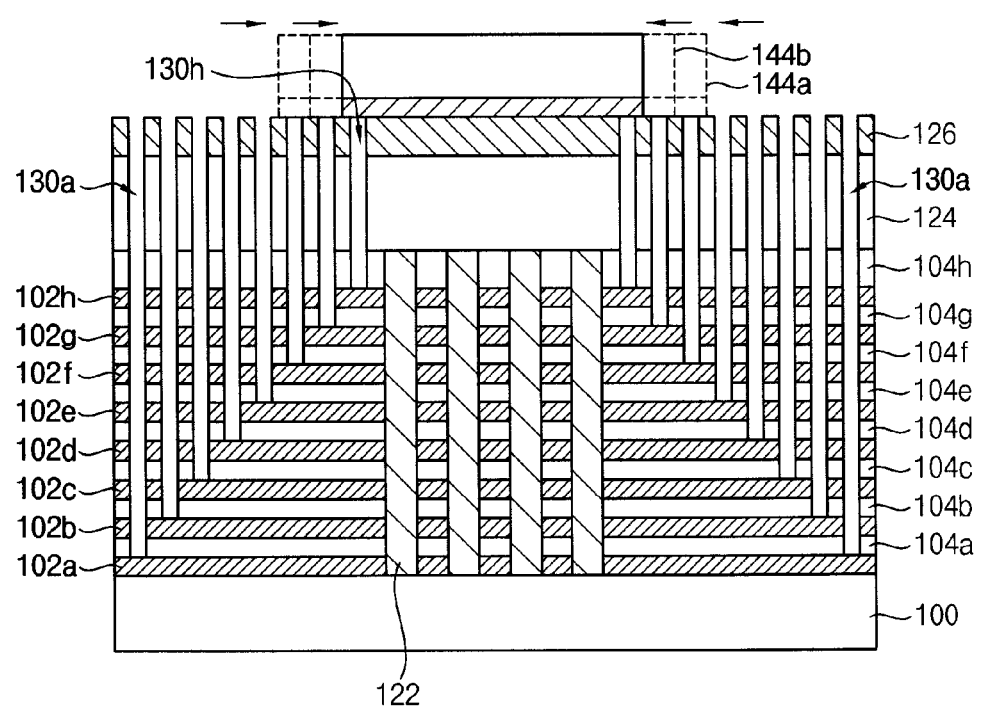

FIGS. 24 and 25 are cross-sectional views for explaining methods of manufacturing a nonvolatile memory device in accordance with example embodiments of inventive concepts.

In accordance with example embodiments of inventive concepts, methods of manufacturing a nonvolatile memory device including a large number of integrated floating gate electrodes and so a large number of contact holes may be illustrated. The manufacturing methods illustrated in FIGS. 24 and 25 may be the same (and/or substantially the same) as the manufacturing method illustrated in FIGS. 12A to 23B except for forming process of the contact holes.

As the number of the contact holes making contact with the floating gate electrodes increases, the number of trimming process of the photoresist pattern also may increase. However, when the trimming process with respect to the photoresist pattern is performed repeatedly, the height of the photoresist pattern may be decreased and the photoresist pattern may not function as an etching mask. The photoresist pattern may be removed by an ashing process after using the photoresist pattern for several times as an etching mask. Then, a new amorphous carbon layer and a new photoresist layer may be formed and a new photoresist pattern may be formed through a photolithography process.

Particularly, initial and preliminary contact holes may be formed by performing the same (and/or substantially the same) processes as explained referring to FIGS. 12A to 16 and thin layers exposed by the initial and preliminary contact holes may be additionally etched.

Referring to FIG. 24, the trimming process may be performed with respect to the photoresist pattern and the conductive structure may be etched e.g. for three times. Then, the remaining photoresist pattern and the amorphous carbon layer may be removed by an ashing process. Through performing the ashing process, a portion of the preliminary contact holes having different depths may be formed at edge portions of the connecting portions.

On the hard mask pattern 126, a new amorphous carbon layer 142 and a new photoresist layer 144 may be formed. The new amorphous carbon layer 142 and the photoresist layer 144 may not bury the preliminary contact holes 130a.

Referring to FIG. 25, a photoresist pattern 144a may be formed by performing a photolithography process. The photoresist pattern 144a may be formed for forming more number of the preliminary contact holes than the number of the preliminary contact holes formed by using the finally trimmed preliminary photoresist pattern before removal. The photoresist pattern 144a may be formed to expose first to fifth preliminary contact holes 130a~130e toward the center portion from the exposed preliminary contact holes formed by the finally trimmed photoresist pattern.

The thin layers exposed through the bottom portions of the initial and preliminary contact holes 130 and the first to fifth preliminary contact holes 130a~130e may be etched using the photoresist pattern 144a as an etching mask. A trimming process with respect to the photoresist pattern 144a may be performed by the same process described in FIGS. 3 to 11. Then, the thin layers exposed through the bottom portions of the initial and preliminary contact holes 130 and the first to sixth preliminary contact holes 130a~130f may be etched using the trimmed photoresist pattern 144b. Through repeating the above described processes, first to eighth contact holes 130a~130h may be formed.

The same (and/or substantially the same) process may be performed as the explanation referring to FIGS. 18A to 23A to manufacture the nonvolatile memory device illustrated in FIGS. 23A and 23B.

Figure 26:
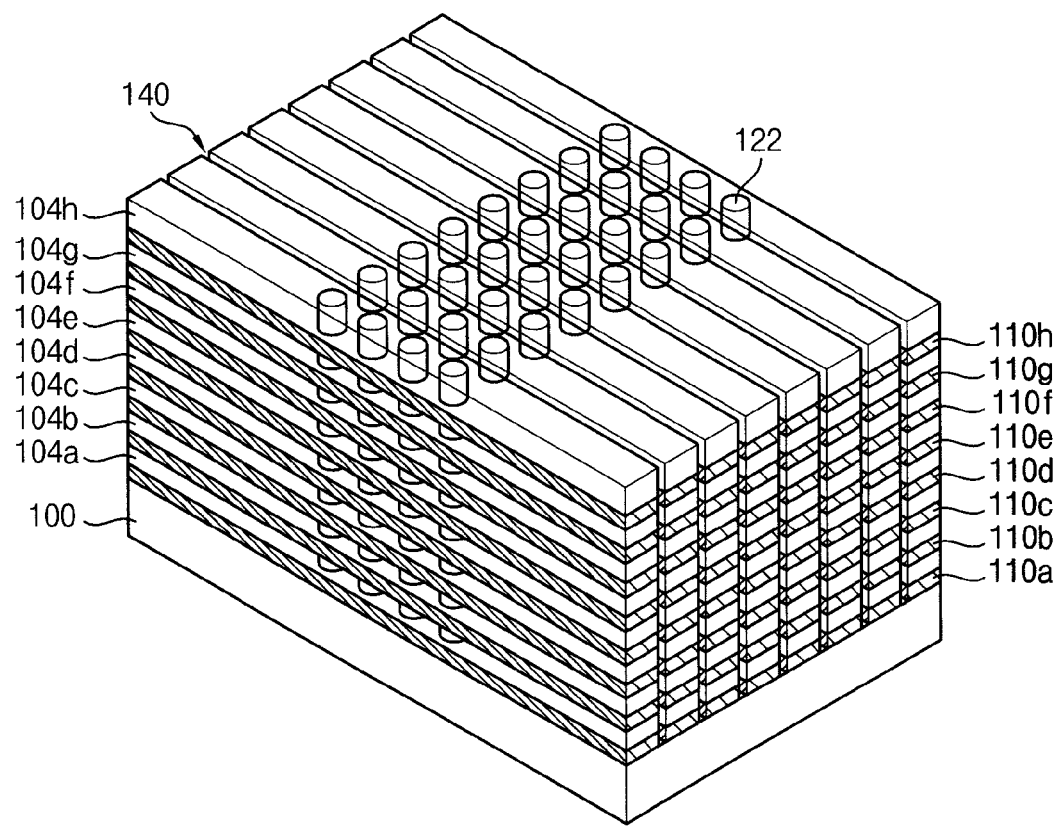
FIGS. 26 and 27 are perspective views for illustrating a method of manufacturing a nonvolatile memory device according to example embodiments of inventive concepts.
Figure 27:
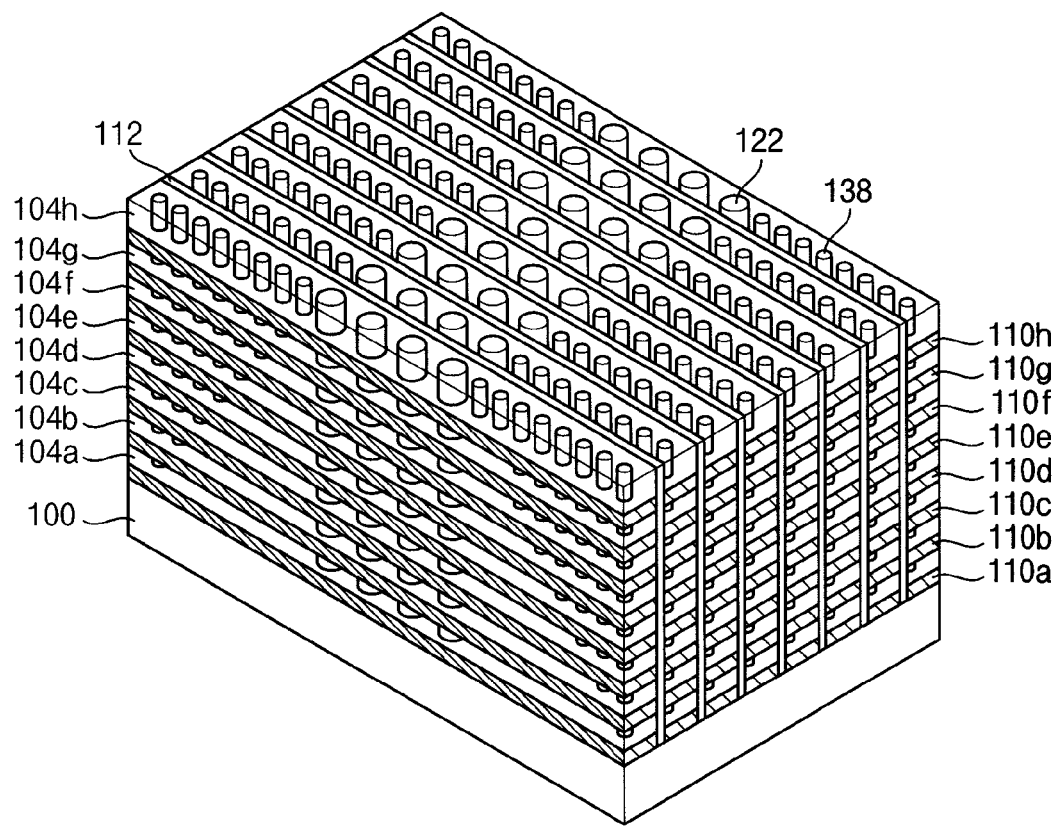

FIGS. 26 and 27 are perspective views for explaining methods of manufacturing a nonvolatile memory device in accordance with example embodiments of inventive concepts.

The same integrated structure illustrated in FIG. 13B may be formed by performing processes explained referring to FIGS. 12A to 13B.

Referring to FIG. 26, insulating interlayers, sacrificial layers and stopping layers provided between semiconductor patterns 122 may be etched to form opening portions 140 having an extending trench shape in a first direction. After forming the opening portions 140, the first to eighth sacrificial layer patterns 102a~102h exposed to sidewalls of the opening portions 140 may be removed to form grooves.

Within the grooves, first to eighth control gate electrodes 110a~110h may be formed. Into the substrate exposed through the bottom portions of the opening portions 140 between the first to eighth control gate electrodes 110a~110h, n-type impurities may be doped to form an impurity doped region (not illustrated) used as a source line S/L. An insulating layer filling up the opening portions 140 may be formed and then planarized by a polishing process to form insulating layer patterns 112.

Referring to FIG. 27, an upper insulating interlayer may be formed on the insulating interlayer. A hard mask pattern may be formed on the upper insulating interlayer. The same (and/or substantially the same) process descried referring to FIGS. 4 to 10 and FIGS. 14 to 17 may be performed to form contact holes exposing the first to eighth control gate electrodes 110a~110h, respectively.

A conductive layer may be formed in the contact holes. The conductive layer may be formed using a metal material. The conductive layer may be formed by forming a barrier metal layer using titanium, titanium nitride, tantalum, tantalum nitride, etc. first and then forming a metal layer using tungsten. The conductive layer may be polished to form contact plugs 138 making connection with the first to eighth control gate electrodes 110a~110h, respectively.

Upper wirings making connection with the contact plugs may be formed to manufacturing the nonvolatile memory device illustrated in FIGS. 23A and 23B.

Figure 28:
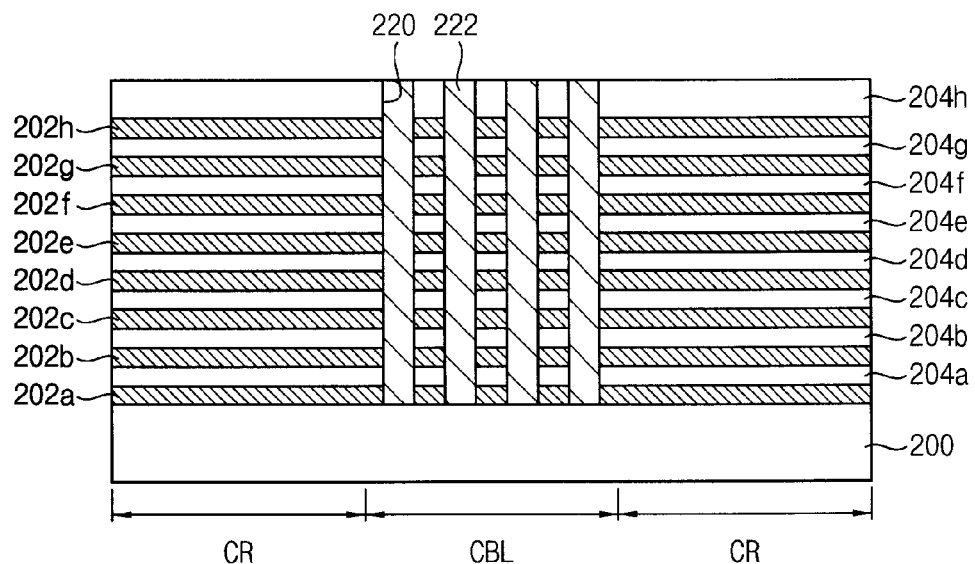
FIGS. 28 and 29 are cross-sectional views for illustrating a method of manufacturing a nonvolatile memory device according to example embodiments of inventive concepts.
Figure 29:
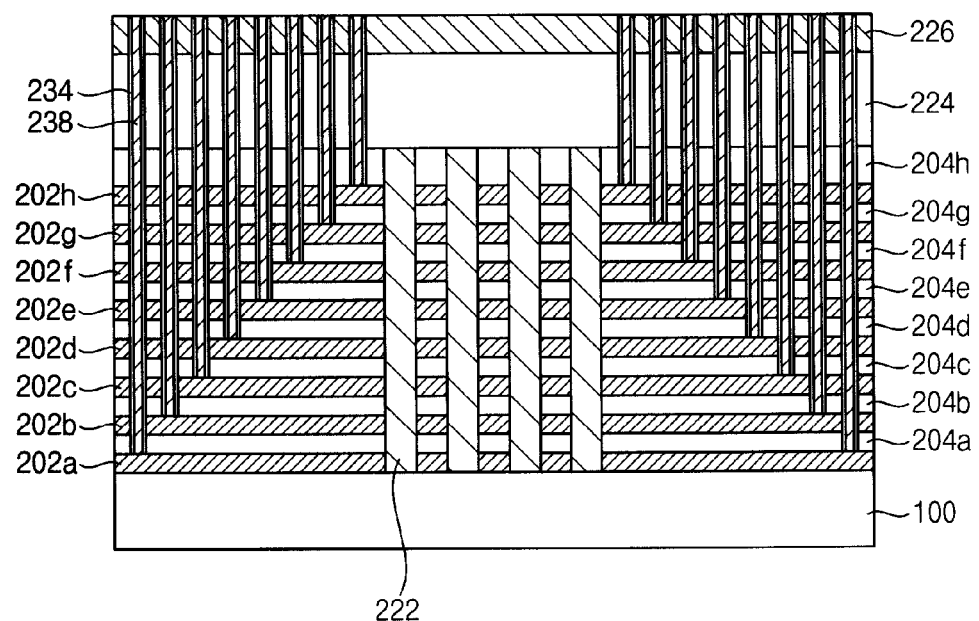

FIGS. 28 and 29 are cross-sectional views for explaining methods of manufacturing a nonvolatile memory device in accordance with example embodiments of inventive concepts.

Referring to FIG. 28, a semiconductor substrate 200 including a cell block region for forming memory cells and separately provided connecting regions may be provided. The semiconductor substrate 100 may be a single crystalline silicon substrate.

A pad insulation layer (not illustrated) may be formed on the semiconductor substrate 200. On the pad insulation layer, first to eighth polysilicon layers 202a~202h and first to eighth insulating interlayers 204a~204h may be alternately integrated one by one. The first to eighth insulating interlayers 204a~204h may be formed by depositing silicon oxide. The polysilicon layers 202a~202h may become word lines through performing following processes.

On the uppermost insulating interlayer 204h, a stopping layer (not illustrated) may be formed. The stopping layer may be formed using silicon nitride.

The first to eighth insulating interlayers 204a~204h, the first and eighth polysilicon layers 202a~202h and the pad insulation layer may be partially etched to form channel holes 220 exposing the surface portion of the substrate 200. In the channel holes 220, a blocking dielectric layer (not illustrated), a charge storing layer (not illustrated) and a tunnel insulation layer (not illustrated) may be formed one by one. A semiconductor material layer filling up the inner portions of the channel holes 220 may be formed on the surface of the tunnel insulating layer. The thin layers may be polished to form semiconductor patterns 222 having pillar shape in the channel holes 220. Through performing the above described process, most of the stopping layer may be removed.

Referring to FIG. 29, the same (and/or substantially the same) processes described referring to FIGS. 14 to 17 may be performed to form contact holes having different depths decreasing along a direction from both side edge portions to the center portion of the connecting regions. Through the bottom portions of each of the contact holes, each of the polysilicon layers in each layer may be exposed. A spacer insulation layer may be conformally formed on sidewalls and bottom portions of the contact holes and along the upper surface of the hard mask pattern. The spacer insulation layer may be anisotropically etched to form spacers 234.

A conductive layer may be formed in the contact holes 230 including the spacers 234 formed thereon. The conductive layer may be formed using a metal material. The conductive layer may be formed by forming a barrier metal layer using titanium, titanium nitride, tantalum, tantalum nitride, etc. first and then forming a metal layer using tungsten. The conductive layer may be polished to form contact plugs 238 making connection with each of the control gate electrodes formed in each layer.

Upper wirings making connection with the contact plugs 238 may be formed to manufacture the nonvolatile memory device.

FIGS. 30 to 34 are cross-sectional views for explaining methods of manufacturing a nonvolatile memory device in accordance with example embodiments of inventive concepts.

According to example embodiments of inventive concepts, methods of forming integrated wirings including a large numbers of integrated conductive layer patterns in a conductive structure and so requiring a large number of forming processes of lots of contact holes may be illustrated.

Figure 30:
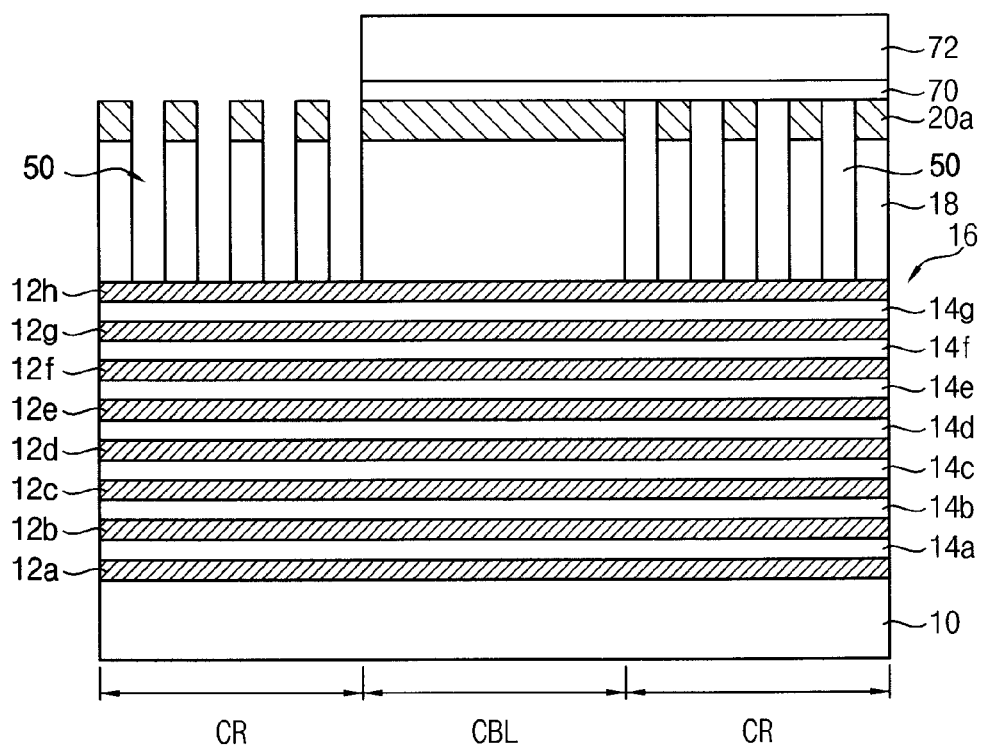
FIGS. 30 to 34 are cross-sectional views for illustrating a method of forming integrated wirings according to example embodiments of inventive concepts.

Referring to FIG. 30, an integrated structure 16 may be formed on a substrate 10. The integrated structure 16 may be formed by conducting the same (and/or substantially the same) process (and/or substantially the same process) described referring to FIG. 3. The integrated structure 16 may include first to eighth contact forming layers 12a~12h and first to seventh insulating interlayers 14a~14g.

An upper insulating interlayer 18 may be formed on the integrated structure 16. On the upper insulating interlayer 18, a hard mask pattern 20a and a first photoresist pattern (not illustrated) may be formed. The upper insulating interlayer 18 may be etched to form first initial and preliminary contact holes 50. Then, the first photoresist pattern may be removed. The first initial and preliminary contact holes 50 may be formed by the same process described referring to FIGS. 4 and 5.

On the upper insulating interlayer 18 including the first initial and preliminary contact holes 50, a first amorphous carbon layer and a second photoresist layer may be formed. The first amorphous carbon layer may be formed so as not to fill up the first initial and preliminary contact holes 50.

A photolithography process may be performed with respect to the second photoresist layer to form a second photoresist pattern 72. The second photoresist pattern 72 may mask the whole cell block region and a portion of the connecting region provided at one side of the cell block region. The second photoresist pattern 72 may selectively expose the connecting region provided at the other side of the cell block region. Accordingly, the second photoresist pattern 72 may expose half of the first initial and preliminary contact holes provided in the connecting regions.

The first amorphous carbon layer may be etched using the second photoresist pattern 72 as an etching mask to form a first amorphous carbon layer pattern 70.

Figure 31:
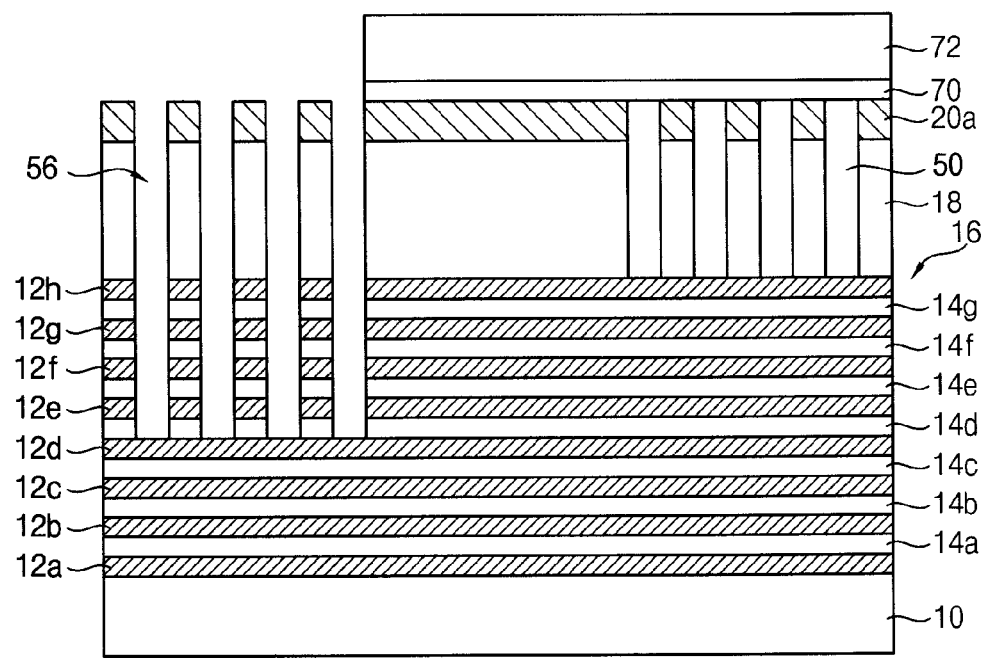

Referring to FIG. 31, the contact forming layers and the insulating interlayers exposed through the bottom portions of the first initial and preliminary contact holes may be partially etched. By conducting the etching process, second initial and preliminary contact holes 56 having greater depth than the first initial and preliminary contact holes 50 may be formed. The second initial and preliminary contact holes 56 may expose a central contact forming layer among the integrated contact forming layers 12a~12h. In Sixth Embodiments, the second initial and preliminary contact holes 56 may expose the fourth contact forming layer 12d among the eight contact forming layers 12a~12h.

Then, the second photoresist pattern 72 and the first amorphous carbon layer pattern 70 may be removed even though not illustrated.

Figure 32:
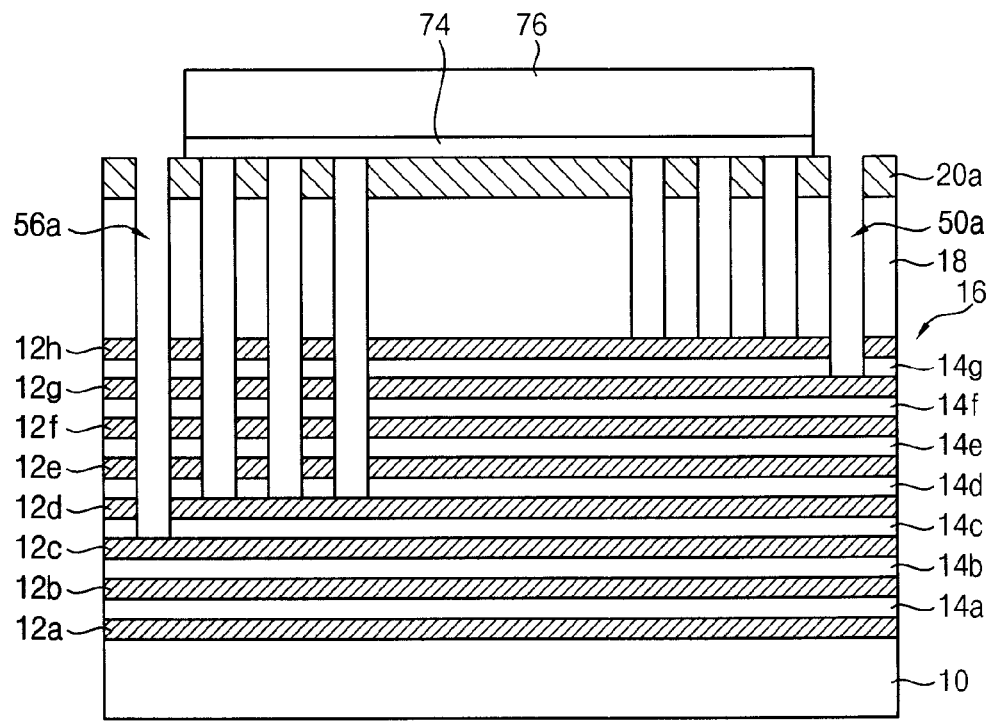

Referring to FIG. 32, a second amorphous carbon layer and a third photoresist layer may be formed on the upper insulating interlayer 18 including the first and second initial and preliminary contact holes 50 and 56. The second amorphous carbon layer may be formed on the upper insulating interlayer 18 while not filling up the inner portions of the first and second initial and preliminary contact holes 50 and 56. The second amorphous carbon layer may be formed on the hard mask pattern 20a while covering inlet portions of the first and second initial and preliminary contact holes 50 and 56. The inner portions of the first and second initial and preliminary contact holes 50 and 56 may have an empty state.

A third photoresist pattern 76 may be formed by performing a first photolithography process with respect to the third photoresist layer. The third photoresist pattern 76 may mask all of the cell block region and most of the connecting regions. As illustrated in FIG. 32, the third photoresist pattern 76 may be formed to expose first and second initial and preliminary contact holes 50a and 56a provided at the first positions from both edge portions of the connecting regions while covering the remaining portion.

The second amorphous carbon layer may be etched using the third photoresist pattern 76 as a mask to form a second amorphous carbon layer pattern 74. One layer among the contact forming layers and one layer among the insulating interlayers exposed through the bottom portions of the first and second initial and preliminary contact holes 50a and 56a may be firstly etched through performing an anisotropic etching. After completing the etching process, a seventh contact forming layer 12g may be exposed through the bottom portion of the first initial and preliminary contact hole 50a and a third contact forming layer 12c may be exposed through the second initial and preliminary contact hole 56a.

Figure 33:
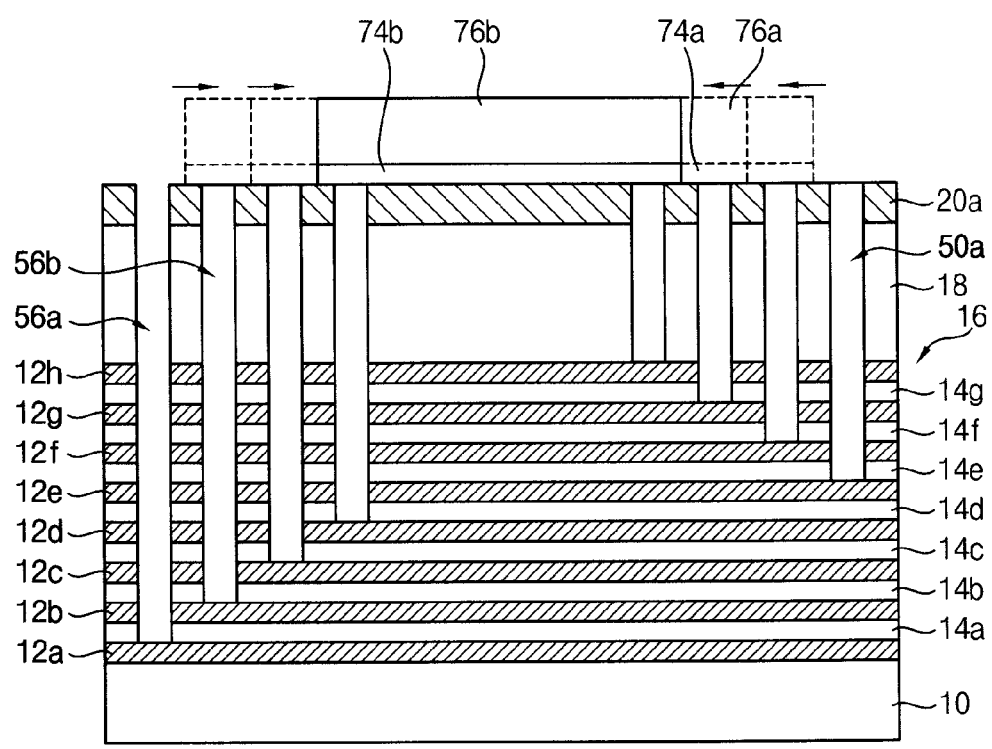

Referring to FIG. 33, a trimming process of partially etching sidewall portions of the third photoresist pattern 76 may be performed to form a fourth photoresist pattern 76a and a third amorphous carbon layer pattern 74a. The third photoresist pattern 76 may be etched by a dry etching process using oxygen or ozone as a main etching gas. The fourth photoresist pattern 76a may be formed to selectively expose the first and second initial and preliminary contact holes 50a, 50b, 56a and 56b provided at the first and second positions from both edge portions to the direction of the center portion of the connecting regions while covering the remaining portion.

Then, a second etching process of an anisotropic etching with respect to one layer among the conductive layer patterns and one layer among the insulating interlayer patterns exposed through the bottom portions of the first and second initial and preliminary contact holes 50a, 50b, 56a and 56b may be performed.

Through performing the second etching process using the fourth photoresist pattern 76a as an etching mask, the first and second initial and preliminary contact holes 50a, 50b, 56a and 56b having different depths may be formed.

A trimming process of partially etching sidewall portions of the fourth photoresist pattern 76a may be performed to form a fifth photoresist pattern 76b. The fifth photoresist pattern 76b may selectively expose the first, and second initial and preliminary contact holes 50a~50c and 56a~56c provided at the first, second and third positions from edge portions to the center portions of the connecting regions while covering the remaining portion.

Then, the exposed third amorphous carbon layer pattern 74a may be removed to form a fourth amorphous carbon layer 74b. A third etching process of an anisotropic etching may be performed with respect to one layer among the conductive layer patterns and one layer among the insulating interlayer patterns exposed through the first and second initial and preliminary contact holes 50a~50c and 56a~56c.

Through performing the etching process, first to fourth contact holes 50a~50d having different depths may be formed in the connecting region disposed at a first side of the cell block region. The depth of the first to fourth contact holes may decrease from the edge portion to the center portion of the connecting region gradually. In addition, fifth to eighth contact holes 56a~56d having different depths may be formed in the connecting region disposed at a second side of the cell block region. The depth of the fifth to eighth contact holes 56a~56d may decrease from the edge portion to the center portion of the connecting region gradually.

As described above, the trimming process and the etching process with respect to the bottom portions of the preliminary contact holes may be repeatedly performed until completing the forming of the contact holes having decreasing depths from the edge portions to the center portion of the connecting regions. Particularly, the trimming process and the etching process of the thin layers exposed through the bottom portions of the preliminary contact holes may be repeatedly performed until the lowermost contact forming layer may be exposed through at least one of the contact holes provided at the first position, for example.

Through performing the process, the first to eighth contact holes 50a~50d and 56a~56d may be formed. Then, the fifth photoresist pattern 76b and the fourth amorphous carbon layer pattern 74b may be removed through an ashing process.

Figure 34:
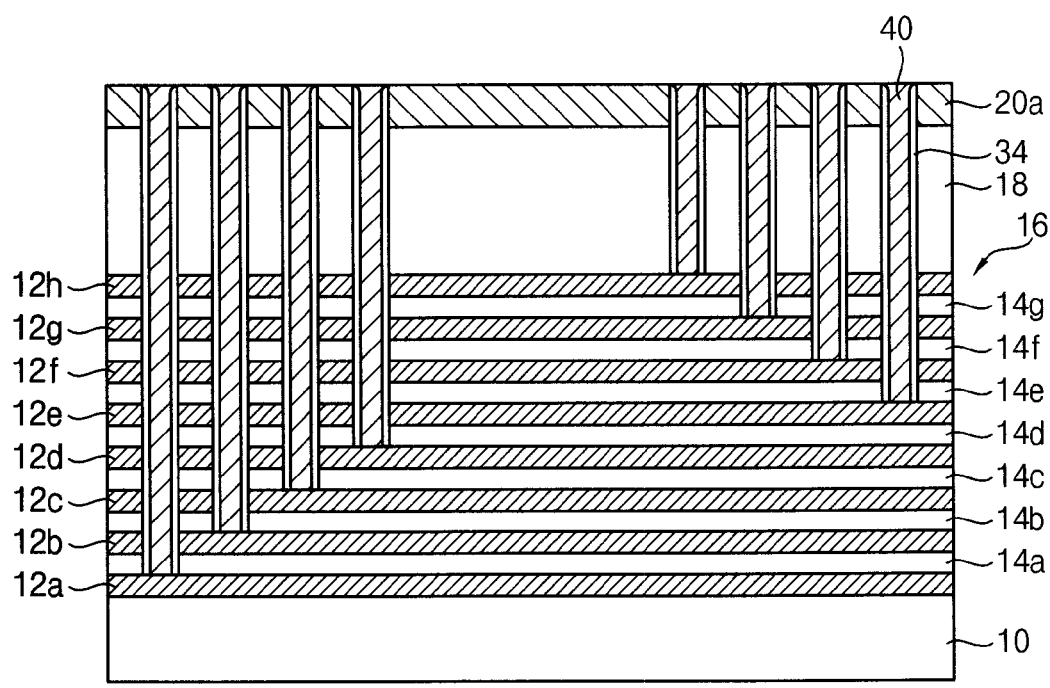

Referring to FIG. 34, spacers 34 may be formed on the sidewalls of the first to eighth contact holes 50a~50d and 56a~56d. Then, a conductive layer may be formed on inner portions of the first to eighth contact holes 50a~50d and 56a~56d and then planarized to form metal contact plugs 40.

An integrated structure may be formed in accordance with the above described methods. In addition, the above-described vertical type semiconductor devices may be manufactured using the above described methods of forming the integrated structure.

Figure 35:
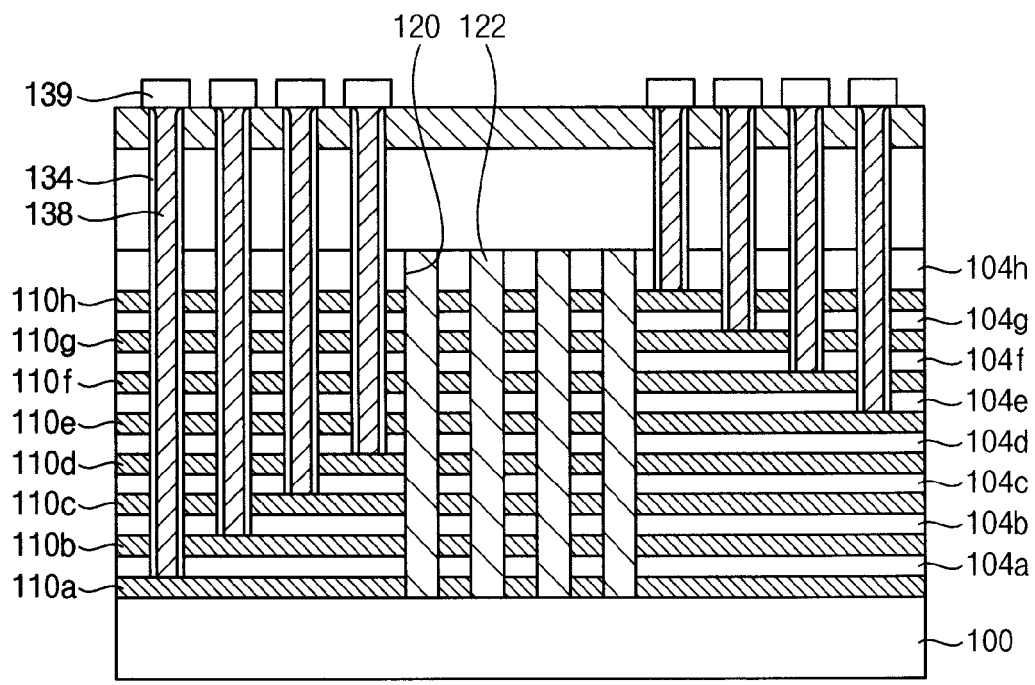
FIG. 35 is a cross-sectional view of a nonvolatile memory device according to example embodiments of inventive concepts.

FIG. 35 is a cross-sectional view illustrating a nonvolatile memory device in accordance with example embodiments of inventive concepts.

Contact plugs may be formed asymmetrically at both sides of the cell region as illustrated in FIG. 35. The nonvolatile memory device may be manufactured by performing the same (and/or substantially the same) processes described in example embodiments of inventive concepts and the contact holes in the connecting regions may be formed by the same (and/or substantially the same) processes described in Sixth Embodiments.

Figure 36:
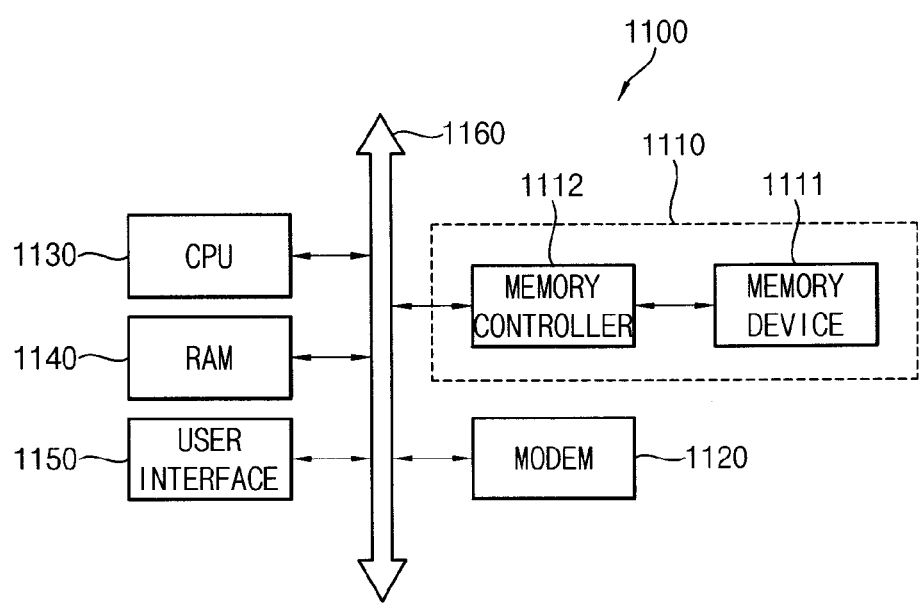
FIG. 36 is a block diagram of an information processing system including a nonvolatile memory device according to example embodiments of inventive concepts.

FIG. 36 is a block diagram of an information processing system including a nonvolatile memory device in accordance with example embodiments of inventive concepts.

Referring to FIG. 36, an information processing system 1100 may include a memory controller 1112 connected to a vertical type nonvolatile memory device 1111 in accordance with example embodiments of inventive concepts. The memory controller may be a logic circuit such as a microprocessor that is configured to control an operation of the memory device 1111.

The information processing system 1100 may include a memory system 1110 and a modem 1120, a central processing system (CPU) 1130, a RAM 1140 and a user interface 1150, respectively connected to a system bus 1160. In the memory system 1110, data processed by the central processing unit 1130 or data inputted from exterior may be stored. Since the memory system 1110 includes the vertical type nonvolatile memory device 1111 in accordance with example embodiments of inventive concepts, the information processing system 1100 may store a large amount of data stably.

An application chipset, a camera image processor (CIS), a mobile DRAM, an input/output apparatus may be further provided to the information processing system 1100 in accordance with the example embodiments of inventive concepts.

As described above, a vertical type nonvolatile memory device including integrated wirings formed by a simplified process may be provided. The vertical type nonvolatile memory device may be applied to various electronic appliances and telecommunicating products.

FIGS. 37A to 37E are cross-sectional views illustrating a method of manufacturing an integrated structure according to example embodiments of inventive concepts.

Figure 37A:
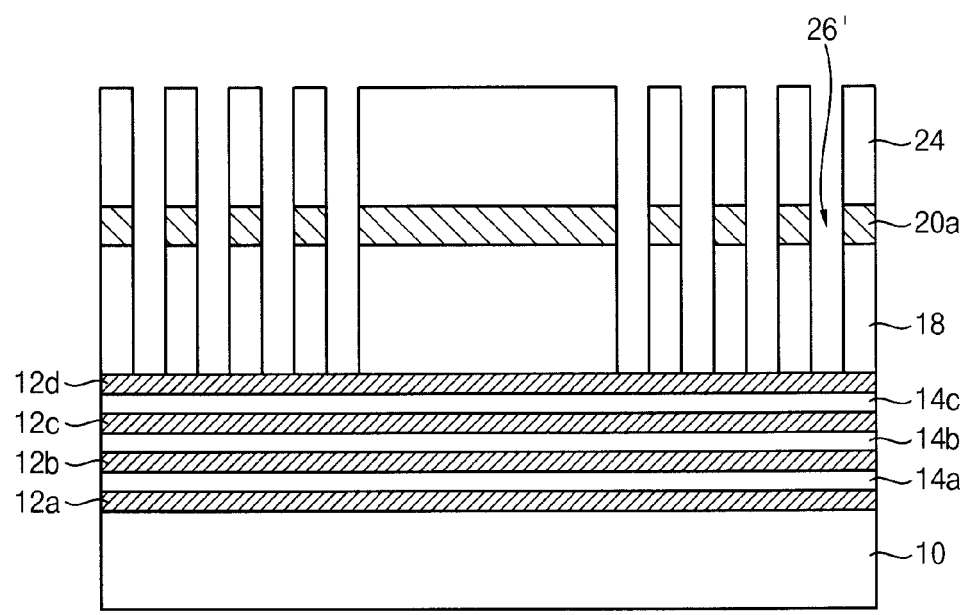
FIGS. 37A to 37E are cross-sectional views illustrating a method of manufacturing an integrated structure according to example embodiments of inventive concepts.

Referring to FIG. 37A, a structure that is the same as the structure illustrated in FIG. 5 may be formed.

Figure 37B:
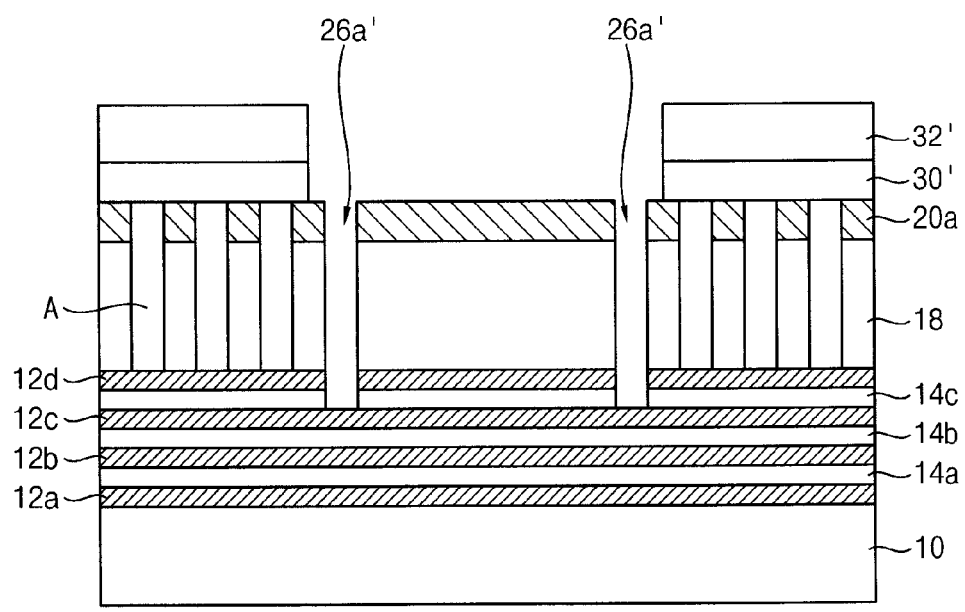

Referring to FIG. 37B, a first amorphous carbon layer and a first photoresist layer are formed on the upper insulating interlayer 18 and hard mask pattern 20*a* while not filling up the initial and preliminary contact holes 26'. Inner portions A of the initial and preliminary contact holes 26' may be empty.

Hereinafter, the initial and preliminary contact holes 26' may be called as first to nth preliminary contact holes 26' one by one from a center portion to the edge portions of the connecting regions.

A first patterning process may be performed with respect to the first photoresist layer to form a first photoresist pattern 32'. The first photoresist pattern 32' may mask all of the connecting regions CR except for the pair P of preliminary contact holes 26' closest to the cell block region CBL.

The first amorphous carbon layer may be etched using the first photoresist pattern 32' as a mask to form a first amorphous carbon layer pattern 30'. In addition, the fourth contact forming layer 12*d* and the insulating interlayer 14*c* exposed through the bottom portions of the first preliminary contact holes 26*a*' may be anisotropically etched to perform a first etch step.

In this case, the hard mask pattern 20*a* may not be etched. Through the first etch step, portions of the contact forming layer 12*d* and the insulating interlayer 14*c* exposed by the first preliminary contact holes 26*a*' may be etched. After completing the first etch step, the third contact forming layer 12*c* may be exposed through the bottom portion of the first preliminary contact holes 26*a*'. The third contact forming layer 12*c* may be an etch stop for the first etch step. The first preliminary contact holes 26*a*' may have a greater depth than that of the remaining and neighboring preliminary contact holes 26'.

Figure 37C:
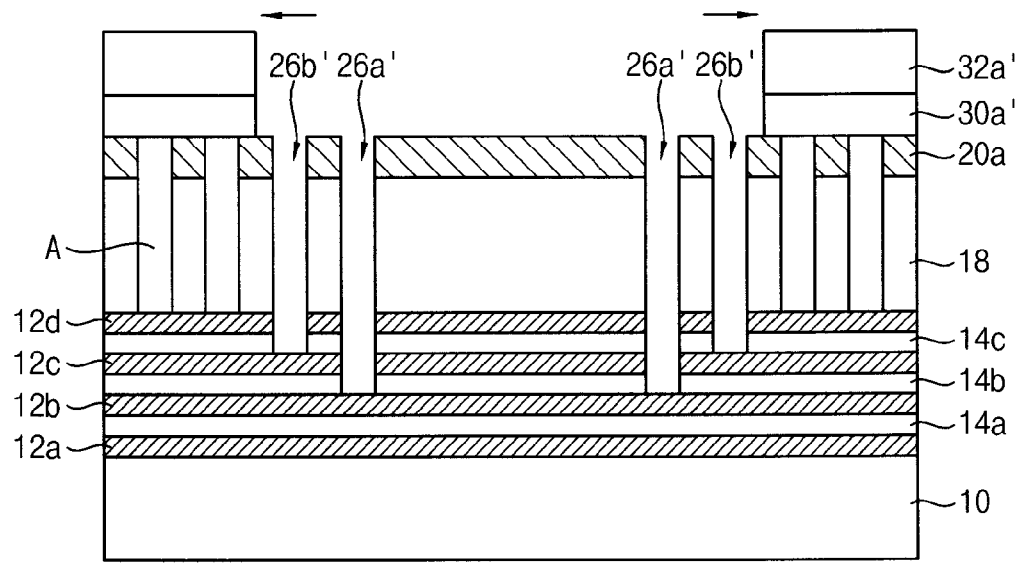

Referring to FIG. 37C, a second photoresist pattern 32*a*' may be formed through performing a trimming process of partially etching sidewall portions of the first photoresist layer pattern 32'. The first photoresist pattern 32' may be trimmed by a dry etching process using oxygen or ozone as a main etching gas. The second photoresist pattern 32*a*' may expose upper portions of the first and second preliminary contact holes 26*a*' and 26*b*' provided at the first and second positions from the center portion to both edge portions of the connecting regions CR. The remaining portion may be covered by the second photoresist pattern 32*a*'.

The first amorphous carbon layer pattern 30' may be etched using the first photoresist pattern 32' as a mask to form a second amorphous carbon layer pattern 30*a*'. In addition, a second etch step may be performed that anisotropically etches the third contact forming layer 12*c* and the second insulating interlayer 14*b* exposed through the bottom portions of the first preliminary contact holes 26*a*' and anisotropically etches the fourth contact forming layer 12*d* and insulating interlayer 14*c* exposed through the second preliminary contact holes 26*b*'.

In this case, the hard mask pattern 20*a* may not be etched. Through the second etch step, the contact forming layers 12*c* to 12*d* and the insulating interlayers 14*b* to 14*c* may be etched. After completing the second etch step, the second contact forming layer 12*b* may be exposed through the bottom portion of the first preliminary contact holes 26*a*', and the third contact forming layer 12*c* may be exposed through a bottom portion of the second preliminary contact holes 26*b*'. The first 26*a*' and second preliminary contact holes 26*b*' may have a greater depth than that of the remaining and neighboring preliminary contact holes.

Figure 37D:
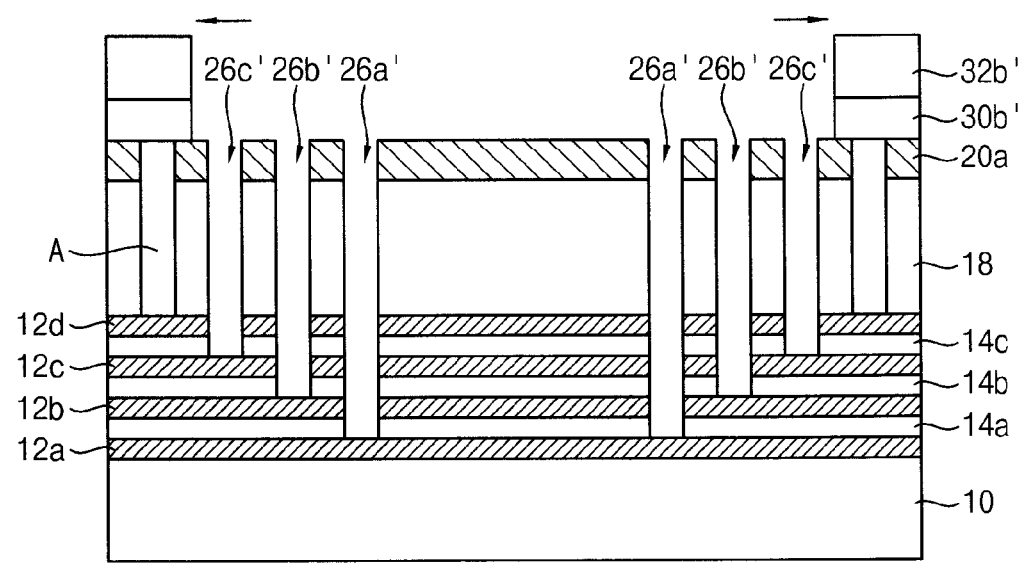

Referring to FIG. 37D, a third photoresist pattern 32*b*' may be formed through performing a trimming process of partially etching sidewall portions of the second photoresist layer pattern 32*a*'. The third photoresist pattern 32*b*' may be trimmed by a dry etching process using oxygen or ozone as a main etching gas. The third photoresist pattern 32*b*' may expose upper portions of the first to third preliminary contact holes 26*a*' to 26*c*' provided at the first to third positions from the center portion to both edge portions of the connecting regions CR. The remaining portion may be covered by the third photoresist pattern 32*b*'.

The second amorphous carbon layer pattern 30*a*' may be etched using the second photoresist pattern 32*a*' as a mask to form a third amorphous carbon layer pattern 30*b*'. In addition, during a third etch step, portions of the contact forming layer 12*d* and insulating layer 14*c* exposed by the third preliminary contact holes 26*c*' are etched, portions of the contact forming layer 12*c* and insulating layer 14*b* exposed by the second preliminary contact holes 26*b*' are etched, and portions of the contact forming layer 12*b* and insulating layer 14*a* exposed by the first preliminary contact holes 26*a*' are etched.

In this case, the hard mask pattern 20*a* may not be etched. After completing the third etch step, the contact forming layer 12*a* may be exposed through the bottom portion of the first preliminary contact holes 26*a*', the contact forming layer 12*b* may be exposed through a bottom portion of the second preliminary contact holes 26*b*', and the contact forming layer 12*c* may be exposed through a bottom portions of the third preliminary contact holes 26*c*'. The first 26*a*' to third preliminary contact holes 26*c*' may have a greater depth than that of the remaining and neighboring preliminary contact holes.

Figure 37E:
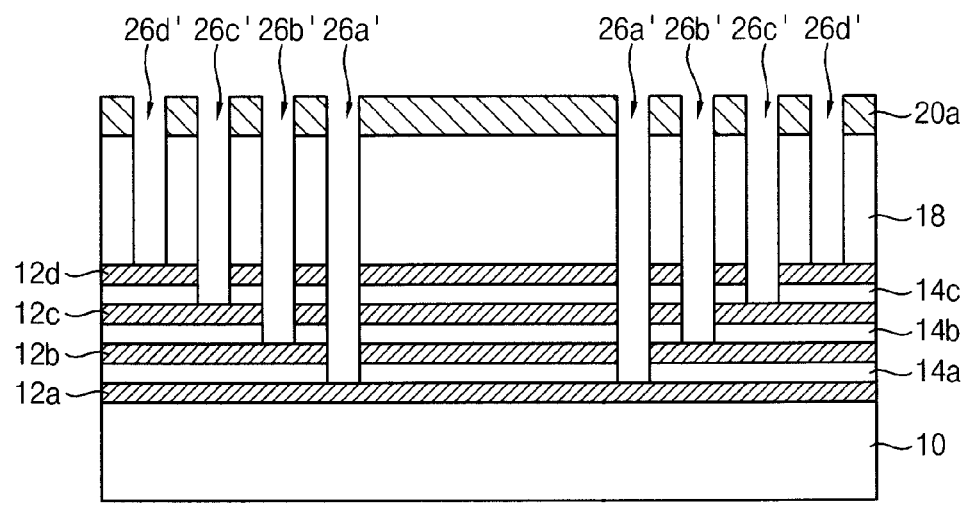

Referring to FIG. 37E, the third photoresist pattern 32*b*' and the third amorphous carbon layer pattern 30*b*' may be removed to expose third preliminary contact holes 26*d*'. The contact forming layer 12*d* may be exposed by a bottom portion of the third preliminary contact holes 26*d*'.

Through performing the above-described processes, the first to fourth contact holes 26*a*'~26*d*' having different depths may be formed in the connecting regions. After forming the first to fourth contact holes 26*a*'~26*d*', the third photoresist pattern 32b' and the third amorphous carbon layer pattern 30b' may be removed through an ashing process.

FIGS. 38A to 38G are cross-sectional views illustrating a method of manufacturing an integrated structure according to example embodiments of inventive concepts.

Figure 38A:
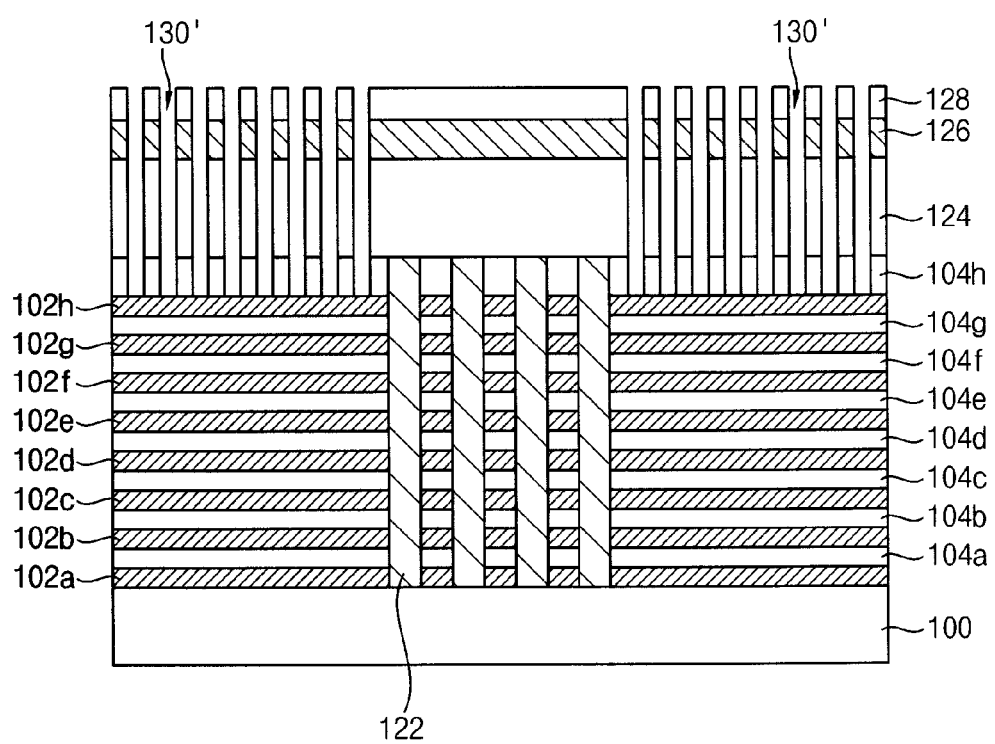
FIGS. 38A to 38G are cross-sectional views illustrating a method of manufacturing an integrated structure according to example embodiments of inventive concepts.

Referring to FIG. 38A, a structure that is the same as the structure illustrate in FIG. 14 may be formed. The photoresist pattern 128 may be removed from the structure in FIG. 38A. After removing the photoresist pattern 128, an amorphous carbon layer and a photoresist layer may be stacked over the hard mask layer pattern 126.

Figure 38B:
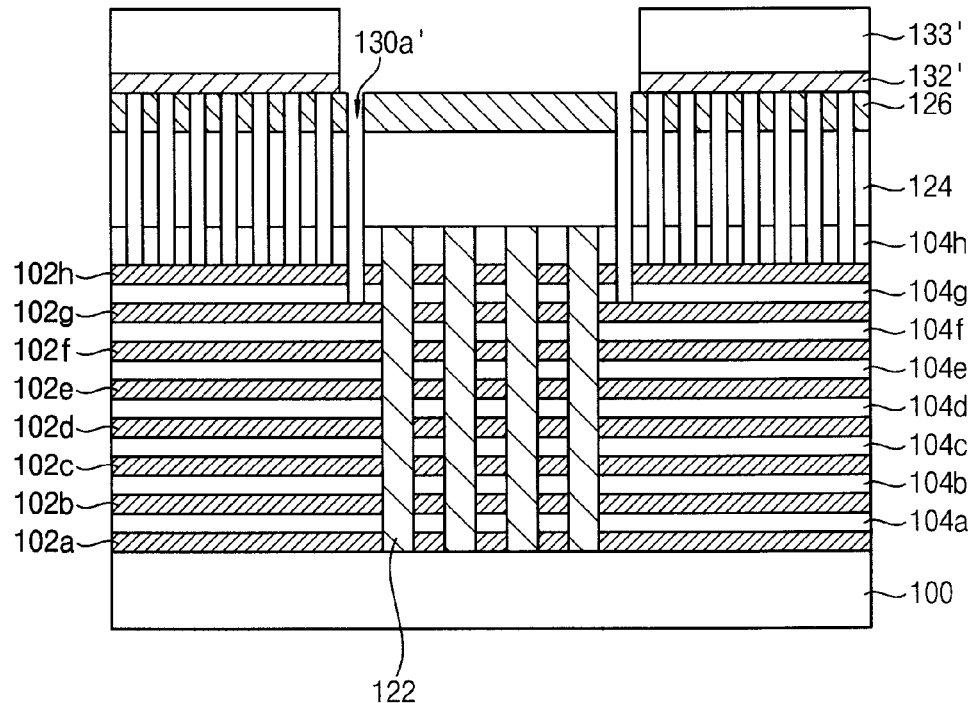

Referring to FIG. 38B, a first photoresist pattern 133' is formed on the hard mask layer pattern 126. A first amorphous carbon layer pattern 132' may be formed by etching the amorphous carbon layer using the first photoresist pattern 133' as an etching mask. The first photoresist pattern 133' covers all of the initial contact holes 130' except for the first preliminary contact holes 130a' closest to the semiconductor patterns 122.

During a first etch step, the contact forming layer 102h and insulating interlayer 104g exposed by the first preliminary contact holes 130a' are anisotropically etched using the first photoresist pattern 133' and hard mask layer pattern 126 as a mask and the contact forming layer 102g as an etch stop.

Figure 38C:
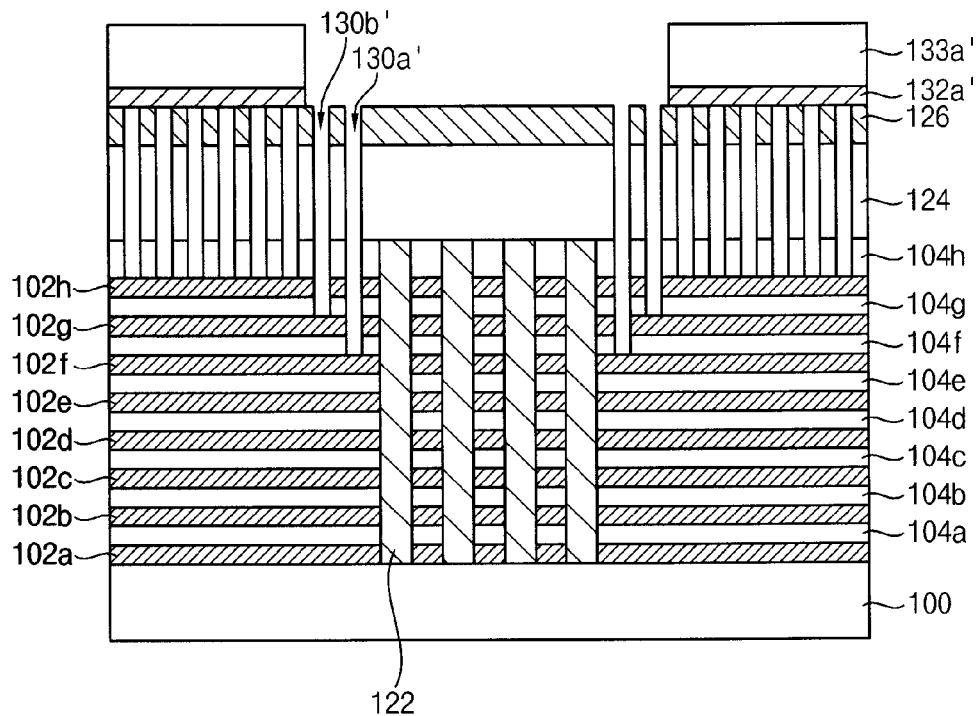

Referring to FIG. 38C, a second photoresist pattern 133a' is formed by laterally trimming the first photoresist pattern 133'. A second amorphous carbon layer pattern 132a' may be formed by etching the first amorphous carbon layer pattern 132' using the second photoresist pattern 133a' as an etching mask. During a second etch step, the contact forming layer 102g and the insulating interlayer 104f exposed by the first preliminary contact holes 130a' are anisotropically etched using the contact forming layer 102f as an etch stop, and the contact forming layer 102h and the insulating interlayer 104g exposed by the second preliminary contact holes 130b' are anisotropically etched using the contact forming layer 102g as an etch stop. The second photoresist pattern 133a' and the hard mask layer pattern 126 are used as a mask during the second etch step.

Figure 38D:
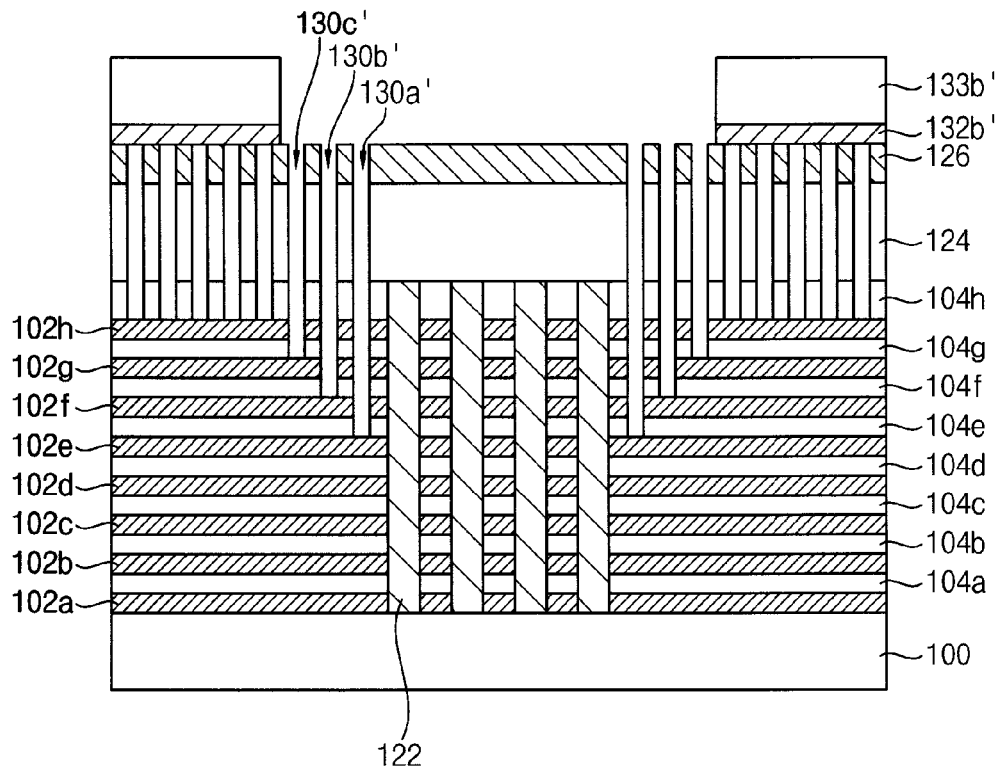

Referring to FIG. 38D, a third photoresist pattern 133b' is formed by laterally trimming the second photoresist pattern 133a'. A third amorphous carbon layer pattern 132b' may be formed by etching the second amorphous carbon layer pattern 132a' using the third photoresist pattern 133b' as an etching mask. During a third etch step, the contact forming layer 102h and the insulating interlayer 104g exposed by the third preliminary contact holes 130c' are anisotropically etched using the contact forming layer 102g as an etch stop, the contact forming layer 102g and the insulating interlayer 104f exposed by the second preliminary contact holes 130b' are anisotropically etched using the contact forming layer 102f as an etch stop, the contact forming layer 102f and the insulating interlayer 104e exposed by the first preliminary contact holes 130a' are anisotropically etched using the contact forming layer 102e as an etch stop. The third photoresist pattern 133b' and the hard mask layer pattern 126 are used as a mask during the third etch step.

Figure 38E:
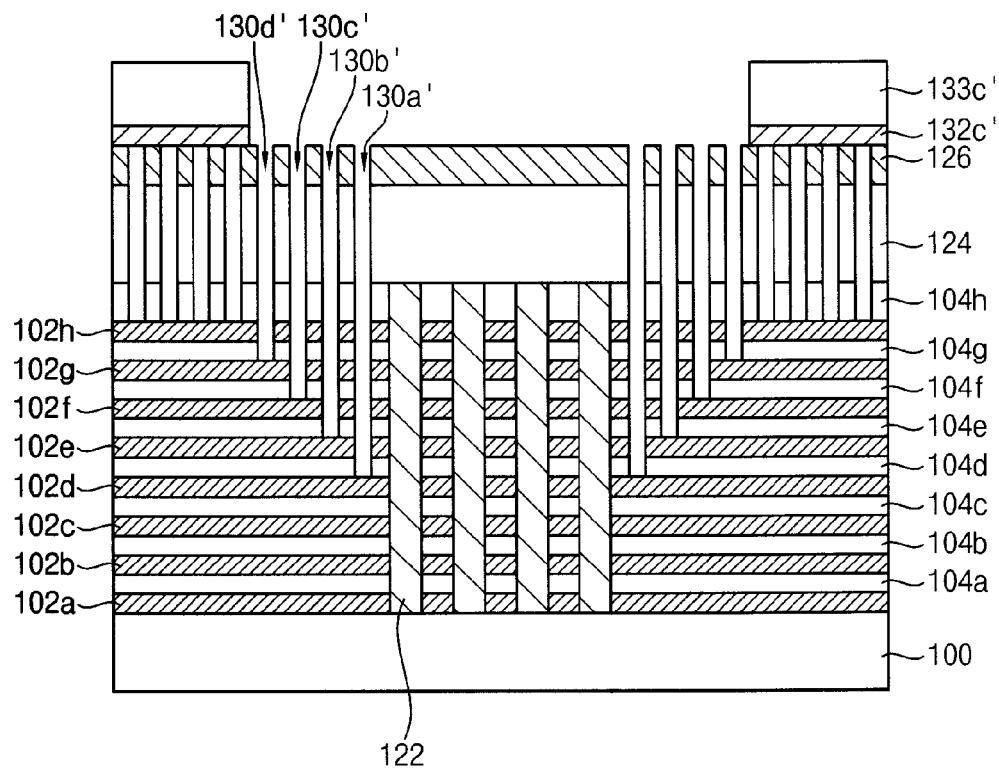

Referring to FIG. 38E, a fourth photoresist pattern 133c' is formed by laterally trimming the third photoresist pattern 133b'. A fourth amorphous carbon layer pattern 132c' may be formed by etching the third amorphous carbon layer pattern 132b' using the fourth photoresist pattern 133c' as an etching mask. During a fourth etch step, the contact forming layer 102h and the insulating interlayer 104g exposed by the fourth preliminary contact holes 130d' are anisotropically etched using the contact forming layer 102g as an etch stop, the contact forming layer 102g and the insulating interlayer 104f exposed by the third preliminary contact holes 130c' are anisotropically etched using the contact forming layer 102f as an etch stop, the contact forming layer 102f and the insulating interlayer 104e exposed by the second preliminary contact holes 130b' are anisotropically etched using the contact forming layer 102e as an etch stop, and the contact forming layer 102e and the insulating interlayer 104d are etched using the contact forming layer 102d as an etch stop. The fourth photoresist pattern 133c' and the hard mask layer pattern 126 are used as a mask during the fourth etch step.

Figure 38F:
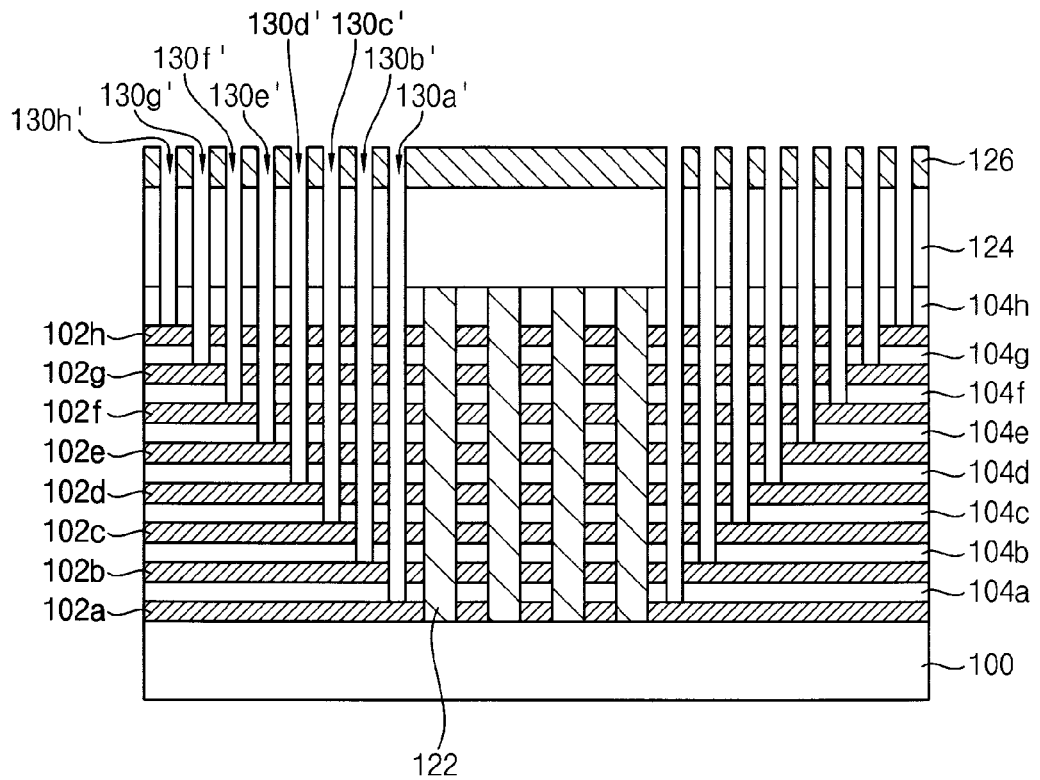

Referring to FIG. 38F, the further resist pattern 133c' is further laterally trimmed in incremental steps to sequentially expose the fifth 130e' to eight 130h' preliminary contact holes. In between each lateral trimming of the resist pattern, portions of contact forming layers 102b to 102h and the insulating interlayers 104a to 104g exposed by the respective preliminary contact holes are anisotropically etched using the underlying contact forming layer as an etch mask.

Figure 38G:
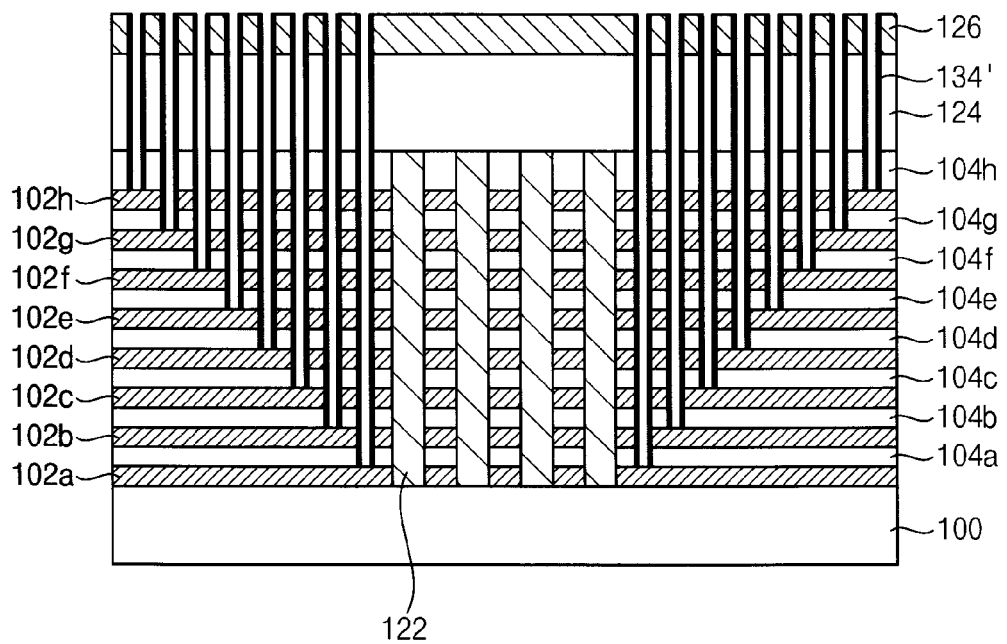

Referring to FIG. 38G, spacers 134' are formed on the sidewalls of the first to eight contact holes 130a' to 130h'. The spacers 134' may be formed of silicon oxide or silicon nitride, but example embodiments are not limited thereto. Similar to FIG. 22, contact plugs may be formed inside the first to eight contact holes 130a' to 130h' after forming the spacers 134'.

While some example embodiments have been particularly shown and described, it will be understood by one of ordinary skill in the art that variations in form and detail may be made therein without departing from the spirit and scope of the claims.

What is claimed is:

1. A method of manufacturing a semiconductor device comprising:
    forming cell patterns and insulating interlayers between each of the cell patterns on a substrate,
        the cell patterns surrounding vertically extruded semiconductor patterns;
    forming an upper insulating interlayer on an uppermost cell pattern of the cell patterns,
        the upper insulating interlayer defining initial and preliminary contact holes;
    forming a first reflection limiting layer pattern and a first photoresist layer pattern on the upper insulating interlayer,
        the first photoresist layer pattern and the first reflection limiting layer pattern exposing a first preliminary contact hole of the preliminary contact holes at a first position from an edge portion of the upper insulating interlayer,
        the first photoresist layer pattern and the first reflection limiting layer pattern covering an inlet portion of the initial and preliminary contact holes;
    performing a first etching process with respect to layers under the first preliminary contact hole to expose a cell pattern at a lower position than a bottom of the first preliminary contact hole;
    repeating a partial removing process of sidewall portions of the first reflection limiting layer pattern and the first photoresist layer pattern and an etching process with respect to exposed layers through bottom portions of the preliminary contact holes one by one, for forming contact holes having decreasing depths from the edge portion to a center portion of the cell patterns;
    forming an insulating spacer on sidewalls of the contact holes; and
    filling up inner portions of the contact holes including the insulating spacer with a conductive material to form contacts.

2. The method of manufacturing a semiconductor device of claim 1, wherein at least one of the contacts is at an exterior side portion of one of the semiconductor patterns.

3. The method of manufacturing a semiconductor device of claim 1, wherein the forming contact holes includes:
partially removing the sidewall portions of the first photoresist pattern and the first reflection limiting layer pattern to form a second refection limiting layer pattern and a second photoresist pattern for selectively exposing first and second preliminary contact holes of the preliminary contact holes, respectively, at first and second positions from the edge portion of the upper insulating interlayer;
performing a second etching with respect to layers exposed through the first and second preliminary contact holes to expose an upper surface of the cell pattern provided at a lower position than respective bottom portions of the first and second preliminary contact holes; and
repeating a partial removing process of the sidewall portions of the reflection limiting layer pattern and the photoresist layer pattern and an etching process with respect to exposed layers through bottom portions of the preliminary contact holes one by one, until a lowermost cell pattern of the cell patterns is exposed through the first preliminary contact hole at the first edge portion of the upper insulating interlayer.

4. The method of manufacturing a semiconductor device of claim 1, further comprising:
forming a hard mask pattern on the upper insulating interlayer.

5. The method of manufacturing a semiconductor device of claim 1, wherein
the cell patterns include contact forming layers, and
the contacts formed by the conductive material connect to the contact forming layers.

6. The method of manufacturing a semiconductor device of claim 5, wherein the contact forming layers include a conductive substance for forming wirings.

7. The method of manufacturing a semiconductor device of claim 5, wherein
the contact forming layers are sacrificial layers for forming conductive substance layers for wirings, and
the contact forming layers include an insulating material that has an etching selectivity with respect to the insulating interlayers.

8. The method of manufacturing a semiconductor device of claim 7, further comprising:
selectively removing the contact forming layers; and
filling up a metal into a space formed after the removal of the contact forming layers.

9. The method of manufacturing a semiconductor device of claim 5, wherein side end portions of the contact forming layers are in parallel.

10. The method of manufacturing a semiconductor device of claim 1, wherein one layer of the cell patterns and one layer of the insulating interlayers are etched while performing an etching process with respect to layers exposed through the preliminary contact holes.

11. The method of manufacturing a semiconductor device of claim 1, wherein the forming of the first reflection limiting layer pattern and the first photoresist layer pattern includes:
forming a reflection limiting layer covering the inlet portion of the initial and preliminary contact holes while keeping space in the initial and preliminary contact holes,
the reflection limiting layer being formed on the upper insulating interlayer;
forming a photoresist layer on the reflection limiting layer;
performing a photolithography process with respect to the photoresist layer to form the first photoresist layer pattern; and
etching the reflection limiting layer using the first photoresist layer pattern as a mask.

12. A method of forming an integrated wiring comprising:
alternately integrating first to n-th insulating interlayers and first to n-th contact forming layers on a substrate;
forming an upper insulating interlayer on an n-th contact forming layer of the first to n-th contact forming layers;
partially etching the upper insulating interlayer to form an upper insulating interlayer pattern that defines initial and preliminary contact holes;
forming a first reflection limiting layer pattern and a first photoresist pattern on the upper insulating layer for covering inlet portions of the initial and preliminary contact holes while selectively exposing first preliminary contact holes at first positions from edge portions of the upper insulating interlayer pattern;
performing a first etching of one of the first to n-th insulating interlayers and first to n-th contact forming layers exposed through the first preliminary contact holes to expose a contact forming layer at a lower position than a bottom portion of the first preliminary contact hole;
partially removing sidewalls of the first photoresist pattern and the first reflection limiting layer pattern to form a second reflection limiting layer pattern and a second photoresist pattern,
the second photoresist and reflection limiting patterns exposing first and second preliminary contact holes at first and second positions from the edge portions of the upper insulating interlayer pattern;
performing a second etching with respect to layers exposed through the first and second preliminary contact holes to expose the contact forming layers respectively provided at a lower position than the bottom portion of the first and second preliminary contact holes,
the contact holes having depths decreasing from the edge portion to a center portion of the cell patterns;
forming an insulating spacer on the sidewalls of the contact holes; and
filling up a conductive material in the contact holes including the insulating spacer to form contacts.

13. The method of forming an integrated wiring of claim 12, wherein side end portions of the first to n-th contact forming layers are in parallel.

14. The method of forming an integrated wiring of claim 12, wherein the contact forming layers are word lines of a vertical type nonvolatile memory device.

15. The method of forming an integrated wiring of claim 12, wherein
the initial and preliminary contact holes are at a first region of the substrate,
the initial and preliminary contact holes expose an upper surface of the n-th contact forming layer, and
the initial and preliminary contact holes are at a second region of the substrate and make contact with the contact forming layer at a lower position than a position of the n-th contact forming layer.

16. A method of manufacturing a semiconductor device comprising:
forming 1 to n-th first and second layer patterns alternatingly stacked,
n being an integer greater than or equal to 3;
forming a mask pattern on the n-th second layer pattern of the 1 to n-th second layer patterns, the mask pattern defining 1 to n-th openings spaced apart in a horizontal direction over a first portion of the n-th second layer pattern;

forming a first multilayer pattern on the mask pattern,
the first multilayer pattern including a first resist pattern on a first reflection limiting pattern,
the first multilayer pattern exposing one of the 1 to n-th openings of the mask pattern;

forming 1 to n-th contact holes having different depths through the 1 to n-th openings by,
(A) etching at least one of the 1 to n-th first and second layer patterns using the mask pattern and the first multilayer pattern as an etch mask and at least one of the 1 to (n−1)-th second layer patterns as an etch stop,
(B) laterally removing part of the first multilayer pattern to expose another opening of the 1 to n-th openings of the mask pattern,
(C) repeating (A) and (B) until 1 to (n−1)-th contact holes are formed, and
(D) removing a remaining portion of the first multilayer pattern to expose the n-th opening as the n-th contact hole; and forming contacts by filling the 1 to n-th contact holes with a conductive material.

17. The method of claim 16, wherein
a material of at least one of the 1 to n-th first layer patterns is different than a material of at least one of the 1 to n-th second layer patterns.

18. The method of claim 16, wherein
a material of the mask pattern has an etching selectivity with respect to a material of the 1 to n-th first layer patterns and a material of the 1 to n-th second layer patterns.

19. The method of claim 16, further comprising:
a plurality of semiconducting patterns extending vertically through a central portion of the 1 to n-th first and second layer patterns,
wherein the central portion of the 1 to n-th first and second layer patterns is adjacent to the first portion of the of n-th second layer pattern.

20. The method of claim 16, wherein
the mask pattern on the n-th second layer pattern further defines 1 to k-th holes spaced apart in the horizontal direction over a second portion of the n-th second layer pattern;
k is an integer equal to n;
the first multilayer pattern exposes one hole of the 1 to k-th holes of the mask pattern; and
the forming 1 to n-th contact holes having different depths through the 1 to n-th openings further includes forming 1 to k-th contact trenches having different depths through the 1 to k-th holes of the mask pattern by,
exposing another hole of the 1 to k-th holes of the mask pattern during the (B) laterally removing part of the first multilayer pattern to expose another opening of the 1 to n-th openings of the mask pattern,
repeating the (A) and (B) until 1 to (k−1)-th contact trenches are formed in addition to the 1 to (n−1)-th contact holes,
exposing the k-th hole as the k-th contact trench during the (D) removing the remaining portion of the first multilayer pattern; and
the forming the contacts further includes filling the 1 to k-th contact trenches with the conductive material.

* * * * *